(12) United States Patent
Selvamanickam et al.

(10) Patent No.: US 7,501,145 B2
(45) Date of Patent: Mar. 10, 2009

(54) HIGH THROUGHPUT CONTINUOUS PULSED LASER DEPOSITION PROCESS

(75) Inventors: Venkat Selvamanickam, Wynantskill, NY (US); Yijie Li, Niskayuna, NY (US); Chan Park, Kyung-Nam (KR)

(73) Assignee: Superpower, Inc., Schenectady, NY (US)

( * ) Notice: Subject to any disclaimer, the term of this patent is extended or adjusted under 35 U.S.C. 154(b) by 176 days.

(21) Appl. No.: 11/554,428

(22) Filed: Oct. 30, 2006

(65) Prior Publication Data

US 2007/0116860 A1    May 24, 2007

Related U.S. Application Data

(62) Division of application No. 10/602,294, filed on Jun. 23, 2003, now abandoned.

(51) Int. Cl.
*B05D 5/12* (2006.01)

(52) U.S. Cl. .............. 427/62; 427/596; 204/192.24; 505/474

(58) Field of Classification Search ............ 427/62, 427/596; 204/192.24; 505/474
See application file for complete search history.

(56) References Cited

U.S. PATENT DOCUMENTS

| | | | | |
|---|---|---|---|---|
| 4,389,970 A | * | 6/1983 | Edgerton | 118/666 |
| 4,793,908 A | | 12/1988 | Scott et al. | |
| 4,966,886 A | * | 10/1990 | Hoshiko | 505/230 |
| 5,151,303 A | | 9/1992 | Hales et al. | |
| 5,196,100 A | | 3/1993 | Goffetre et al. | |
| 5,372,089 A | * | 12/1994 | Yoshida et al. | 117/98 |
| 5,490,912 A | | 2/1996 | Warner et al. | |
| 5,760,366 A | * | 6/1998 | Haruta et al. | 219/121.68 |
| 5,846,911 A | | 12/1998 | Freyhardt et al. | |
| 6,022,832 A | | 2/2000 | Fritzemeier et al. | |
| 6,453,264 B1 | | 9/2002 | Maguire et al. | |
| 6,491,759 B1 | * | 12/2002 | Christen et al. | 118/722 |
| 6,506,439 B1 | | 1/2003 | Usoskin et al. | |
| 6,509,070 B1 | * | 1/2003 | Voevodin et al. | 427/572 |
| 6,602,347 B1 | | 8/2003 | Shimoda et al. | |
| 6,770,175 B2 | | 8/2004 | Domoto et al. | |
| 6,908,362 B2 | * | 6/2005 | Selvamanickam et al. | 451/28 |
| 2004/0016401 A1 | * | 1/2004 | Ignatiev et al. | 118/718 |
| 2004/0040506 A1 | | 3/2004 | Ovshinsky et al. | |
| 2005/0092253 A1 | * | 5/2005 | Selvamanickam | 118/723 EB |
| 2005/0220986 A1 | * | 10/2005 | Selvamanickam et al. | 427/62 |
| 2007/0129255 A1 | * | 6/2007 | Varanasi et al. | 505/100 |

FOREIGN PATENT DOCUMENTS

| EP | 1 143 532 A1 | 1/2001 |
|---|---|---|
| EP | 1143532 | * 10/2001 |

* cited by examiner

*Primary Examiner*—Bret Chen
(74) *Attorney, Agent, or Firm*—Larson Newman Abel & Polansky, LLP

(57) ABSTRACT

A method includes feeding an uncoated substrate from a payout spool into a multi-chambered vacuum apparatus. The vacuum apparatus includes a plurality of deposition chambers defining an extended deposition zone, a multi-zone substrate heater located within the extended deposition zone, and multiple high-temperature superconductor (HTS) targets located within and being arranged linearly along the extended deposition zone. The multiple HTS targets include a first and second HTS target. The first and second HTS targets include a HTS material. The method farther includes translating the uncoated substrate along a translation path through the plurality of deposition chambers, impinging multiple laser beams simultaneously upon the multiple HTS targets and forming multiple overlapping plumes of HTS material within the extended deposition zone, depositing HTS material on a first major surface of the uncoated substrate to provide a coated substrate, and winding the coated substrate onto a take-up spool.

19 Claims, 9 Drawing Sheets

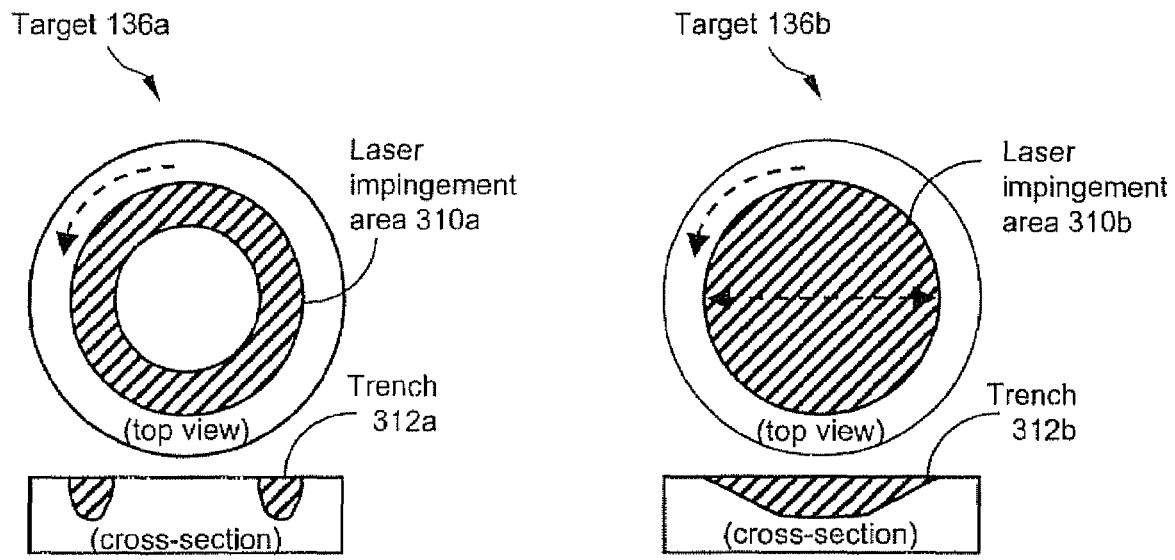
FIG. 2D
FIG. 2E
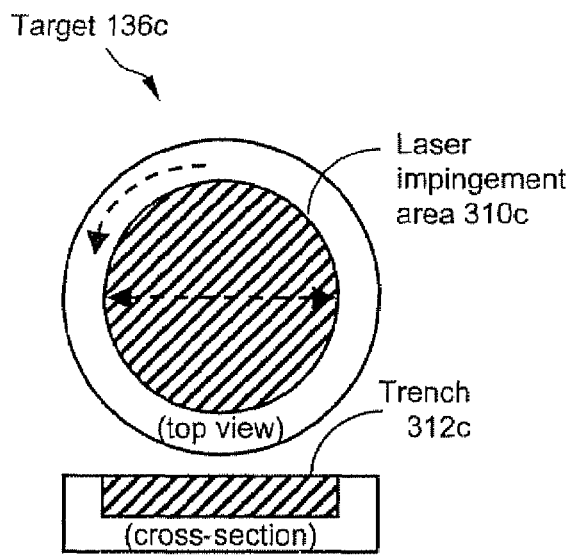
FIG. 2F

HIGH THROUGHPUT CONTINUOUS PULSED LASER DEPOSITION PROCESS

CROSS-REFERENCE TO RELATED APPLICATION(S)

The present application is a divisional application of U.S. application Ser. No. 10/602,294 filed Jun. 23, 2003 now abandoned, which is incorporated herein by reference in its entirety.

FIELD OF THE INVENTION

The present invention relates to an apparatus and method for forming a high-temperature superconducting film on a long tape substrate at speeds suitable for large-scale production, includes a spooling system for use in a high-throughput, continuous pulsed laser deposition (PLD) process.

BACKGROUND OF THE INVENTION

In the past three decades, electricity has risen from 25% to 40% of end-use energy consumption in the United States. With this rising demand for power comes an increasingly critical requirement for highly reliable, high quality power. As power demands continue to grow, older urban electric power systems in particular are being pushed to the limit of performance, requiring new solutions.

Wire forms the basic building block of the world's electric power system, including transformers, transmission and distribution systems, and motors. The discovery of revolutionary high-temperature superconductor (HTS) compounds in 1986 led to the development of a radically new type of wire for the power industry; this discovery is the most fundamental advance in wire teleology in more than a century.

HTS wire offers best-in-class performance, carrying over one hundred times more current than do conventional copper and aluminum conductors of the same physical dimension. The superior power density of HTS wire will enable a new generation of power industry technologies. It offers major size, weight, and efficiency benefits. HTS technologies will drive down costs and increase the capacity and reliability of electric power systems in a variety of ways. For example, HTS wire is capable of transmitting two to five times more power through existing rights of way.

This new cable will offer a powerful tool to improve the performance of power grids while reducing their environmental footprints. However, to date only short lengths of coated conductor wire samples have been fabricated at high performance levels with any of the conventional fabrication processes.

In order for HTS technology to become commercially viable for use in the power generation and distribution industry, it will be necessary to develop techniques for continuous, high-throughput production of HTS tape. Several challenges must be overcome in order to enable the cost-effective production of long lengths (i.e., several kilometers) of HTS-coated conductor wire.

Vapor deposition is a process for manufacturing HTS tape in which vapors of superconducting material such as YBCO are deposited on a tape-like length of buffered metal substrate, thereby forming an HTS coating on the tape substrate. Well-known vapor deposition processes include physical vapor deposition (PVD), chemical vapor deposition (CVD)), and pulsed laser deposition (PLD). PLD has shown great promise for the deposition of superconducting thin films, due in large part to its operational simplicity, its flexibility in vacuum requirements, and the congruent, stoichiometric transfer of material that results from the generation of a highly forward-directed plume from target to substrate.

In a pulsed laser deposition (PLD) process in which a laser is used to evaporate a material, where atoms of the material subsequently coat a surface that is exposed to the evaporated material, thereby forming a film on that surface. PLD is a process suitable for manufacturing HTS wires with high current-carrying capacity In this case, a target comprising a stoichiometric chemical composition of the desired layer is ablated by a pulsing laser, forming a plume of ablated material to which a buffered substrate is exposed, thereby coating the buffered substrate with the desired material and forming a coated wire or tape. Using a PLD process it is possible to deposit a superconducting layer atop a translating flexible buffered polycrystalline metal tape in a continuous, assembly line manufacturing process. However, to date only short lengths of coated conductor wire samples have been fabricated at high performance levels using prior art vapor deposition processes and equipment.

The manufacture of long lengths of HTS tapes via a PLD process necessitates a system that provides for the translation of the tapes through a deposition chamber where they receive the desired thin film coating. Youm, U.S. Pat. No. 6,147,033, dated Nov. 14, 2000, and entitled "Apparatus And Method For Forming A Film On A Tape Substrate," provides a tape transport system particularly well suited for translating a substrate tape through a deposition chamber.

As described by Youm, the superconducting film is deposited on the tape substrate wound around a cylindrical substrate holder inserted in an auxiliary chamber housed completely within a main deposition chamber. The cylindrical substrate holder rotates during the whole deposition process. Vapors of film materials are supplied form the main chamber through an opening between the two chambers. According to Youm, it is possible to form HTS film rapidly onto a tape substrate having a length up to 300 meters. While this represents a step toward the large-scale production of HTS coated tape, it is limited in its scalability. To achieve significantly longer lengths of HTS coated tape the cylindrical substrate holder must increase in size accordingly, making it impractical to be housed within the main vapor deposition chamber. Thus, a drawback of the vapor deposition process described in Youm is that the system is not easily scalable to produce long lengths (e.g., several kilometers) of HTS coated tape and is therefore not suited for the large-scale production of HTS coated wire.

Several other challenges must be overcome in order to enable the cost-effective production of long lengths (i.e., several kilometers) of HTS coated conductor wire.

A first challenge to the continuous deposition of HTS tapes utilizing a reel-to-reel tape transport system that is not overcome by Youm is the maintenance optimum tape tension throughout the extended deposition runs necessary to high-throughput systems. If the correct level of tautness is not maintained, the tape sags. This results in a variation in the target-to-substrate distance and a compromise of the thin film uniformity.

A second technical challenge to the continuous deposition of HTS tapes utilizing a reel-to-reel tape transport system that is not overcome by Youm is the maintenance of the tape at the optimal speed throughout extended deposition runs. As the spools rotate and the tape is translated through a chamber, the tape must remain at the same position within the deposition zone, regardless of the radii of tape housed on each spool. Lateral, as well as longitudinal, movement of the tape results in an inconsistent and non-uniform deposition resulting in variations in film thickness. The importance of film uniformity cannot be an overemphasized: if there is an insufficient superconducting quality at a single point over the entire length of a few hundred meters of tape, the current carrying capacity of the entire length of tape is compromised. Further, any elements that serve to position the tape must do so in such a way as to not induce stress or strain in the tape, which may damage the delicate thin films Another technical challenge not overcome by Youm is how to wind the tape onto a spool subsequent to its undergoing the deposition process without damaging the delicate thin film housed thereon. The ceramic grains of superconducting films may fracture if bent beyond a certain strain, which may result in a decrease in the critical current-carrying capacity of the finished superconductor tape.

To achieve the proper bonding of the evaporated material to the substrate during a typical PVD, CVD, or PLD process it is necessary to heat the substrate. Thus, a substrate heater that is capable of sustaining the substrate at a process temperature ranging typically from 500 to 1500° C. is required Current PVD, CVD, or PLD processes typically employ a stationary substrate mounted on a stationary substrate holder, where the substrate holder incorporates a heating element. Since the substrate is in direct contact with the heated substrate holder, heating of the substrate takes place by conduction.

An example of a conventional stationary substrate heater is disclosed in Chen et al., U.S. Pat. No. 6,066,836, dated May 23, 2000 and entitled "High temperature resistive heater for a process chamber". Chen et al. describes a structure for a processing apparatus such as a chemical vapor deposition chamber that includes a resistively heated substrate holder including a support surface that includes an additional resistive heating element. The heated substrate holder is disk-shaped to accommodate a substrate, such as a wafer, in a semiconductor application. Chen's substrate heater includes a heating element that provides a single heating zone, that is, one uniform temperature is maintained across the entire substrate However, in the case of a continuously translating substrate as is necessary for a continuous flow manufacturing process, it is difficult to maintain a uniform temperature profile using resistive heaters as disclosed by the prior art, Any local loss of contact with the heating element by a rapidly moving substrate can cause large temperature variations and in turn inhomogeneities in the coating film. Consequently, a technical challenge to overcome is how to heat a rapidly moving substrate in a continuous flow high-throughput manufacturing process for producing long lengths of HTS-coated wire.

In the case of a translating substrate in a continuous flow manufacturing process, multiple temperature zones having different temperature requirements, such as a preheating zone, a deposition zone, and a cooling zone, are desirable. Current substrate heaters do not provide multiple heating zones with differing temperature ranges as required for continuous flow manufacturing of HTS-coated wire and thus are not suited for use in the large-scale production of HTS-coated wire, In the PLD process, a film is deposited on a substrate by the action of a laser beam impinging on a target material that is located in close proximity to the substrate, thereby creating a plume of ablated material (plasma) to which the substrate is exposed. Conventional PLD systems utilize a single laser beam that impinges on a target mounted on a target manipulator. The target manipulator provides an appropriate target rotation and oscillation. In a particular well-known example, multi-target manipulators may hold multiple targets for sequential use in a PLD process. In this case, as the material of any given target is consumed during the PLD process, the multi-target manipulator indexes from one target to the next. However, in the large-scale continuous production of HTS-coated wire, a multi-laser beam PLD process, in which multiple laser beams impinge on multiple targets simultaneously, may be used, thereby simultaneously creating multiple overlapping plumes to which a translating substrate is exposed. In this way, the deposition region is expanded in length, thereby improving the overall throughput of the PLD process compared with a single laser/single target PLD process. Conventional target manipulators are therefore of limited use in a multilaser beam PLD application.

An example of a conventional target manipulator is described in Kim et al., U.S. Pat. No. 5,942,040, entitled "Multi-Target Manipulator For Pulsed Laser Deposition Apparatus." Kim et al. discloses a multi-target manipulator for a pulsed laser deposition apparatus, including a driving mechanism that includes a stepping motor and a motion feed for providing rotation to the target disk driving shaft and the target driving motor shaft. The driving mechanism further includes a driving transmission and head-supporting member that transmits a rotational motion for rotating the target disk and the target so as to locate a target material on the focal point of the laser beam.

Although Kim et al provides a multi-target manipulator, the multiple targets are arranged on a circular disk with the intent of being indexed from one to another for consumption one at a time. Although it is conceivable that multiple lasers could be focused on all targets simultaneously, it is not practical for a continuous flow application in which a substrate tape is translating in a straight line, thereby requiring the targets to be arranged in a straight line. A further limitation is that Kim et al.'s the multi-target manipulator provides rotation to only one target at a time. This type of multi-target manipulator is therefore not suited for use in the large-scale production of HTS-coated wire utilizing a continuously translating substrate through a deposition chamber.

It is conceivable that several target manipulators, such as Kim et al.'s multi-target manipulator, could be used in combination with multiple laser beams arranged sequentially in a straight line along the path of the translating substrate tape. However, using such an arrangement of several conventional target manipulators in a multi-laser beam PLD system is very costly and therefore not practical. Also, conventional target manipulators occupy lot of space and as a result, there will be large gaps between targets. This will result in large gaps between plumes from the targets when used with multiple lasers. Consequently, this arrangement of several conventional target manipulators is not economically or practically suited for use in the large-scale production of HTS-coated wire.

It is therefore an object of the invention to provide a tape transport system well suited to the continuous high-throughput manufacture of HTS tapes.

It is another object of the invention to provide a tape transport system that maintains optimum tape tension throughout extended deposition runs.

It is yet another object of the invention to provide a tape transport system that maintains tapes at an optimal target-to-substrate distance throughout extended deposition runs.

It is yet another object of the invention to provide a tape transport system that prevents damage to the newly deposited superconducting films as the tape winds onto a take-up spool.

It is an object of the invention to provide a substrate heater for use with a non-stationary substrate in a continuous flow vapor deposition process.

It is another object of the invention to provide a substrate heater with multiple independent heating zones for use with a non-stationary substrate in a continuous flow vapor deposition process.

It is yet another object of the invention to provide a substrate heater that achieves the desired heating of a translating substrate by a combination of conductive and radiative heating during a continuous flow vapor deposition process.

It is an object of the invention to provide a multi-target manipulator that provides multiple targets arranged in line for simultaneous use in a multi-laser beam PLD process for the large-scale production of HTS-coated wire.

It is yet another object of the invention to cost-effectively provide a multi-target manipulator for use in a multi-laser beam PLD process for the large-scale production of HTS-coated wire.

It is an object of the present invention to provide a PLD apparatus and method for forming highly uniform HTS film on a tape substrate.

BRIEF SUMMARY OF THE PRESENT INVENTION

The present invention is a PLD system and method for use in the large-scale, high-throughput production of HTS coated wire. In particular, the present invention includes a high-throughput PLD manufacturing system that provides continuous production of HTS coated tape via the deposition of, for example, yttrium-barium-copper-oxide ($YBa_2Cu_3O_7$ or "YBCO") film onto a buffered metal substrate.

In its simplest form, the PLD system of the present invention includes a main deposition chamber disposed between a first and second vacuum chamber. The PLD system further includes a controlled reel-to-reel spooling system capable of translating buffered metal substrate tape through the multiple chambers. The spooling system includes a payout spool disposed within the first vacuum chamber for feeding the substrate tape into the deposition chamber and a take-up spool disposed within the second vacuum chamber for receiving the HTS-coated wire. The size of the deposition chamber is unaffected by the size of the spools which is variable depending on the length of the substrate tape wound thereon.

The main deposition chamber further includes elements that allow the formation of a deposition zone that is longer than those in conventional deposition systems without sacrificing the uniformity of deposition of the coating material on the substrate. Such elements include multiple laser beams, which impinge simultaneously upon multiple targets mounted on a multi-target manipulator, thereby simultaneously forming multiple plumes of HTS particles, to which the substrate is exposed in a deposition zone.

The presence of multiple overlapping plumes arranged sequentially effectively lengthens the deposition zone wherein the substrate is exposed to the evaporant material. The thickness of the HTS film deposited onto the substrate tape is controlled by the rotational speed of a payout and take-up spool within the spooling system, thereby controlling the time that the substrate is present in the deposition zone.

The reel-to-reel tape transport system includes a pair of spools driven by a pair of identical motors that force the rotation and thereby the translation of a substrate tape at a rate of between 10 and 500 meters per hour through one or more adjacent deposition chambers in which a layer of superconducting material, such as YBCO, is deposited. The motors are managed by a controller such that, as one motor drives the spools, the other imparts an amount of resistance sufficient to provide an optimal tension in the tape. A pair of idlers maintains the tape at an optimal position as it translates through a deposition zone. The idlers come into contact with the non-coated side of the tape as the tape winds off a payout spool and onto a take-up spool; the idlers shift in their positioning so as to accommodate the changing radii of tape housed on each spool.

Subsequent to undergoing the deposition of a superconducting layer, the tape is made to wind onto a take-up spool such that the HTS-coated side winds in an orientation toward the center of the spool rather than toward the outer perimeter of the spool, as the superconducting film is less likely to be damaged when under compressive strain rather than when under tensile strain. As an additional protective measure, a length of polymer interleaf may be wound into the take-up spool between tape layers as the tape winds onto the take-up spool, thereby protecting the superconducting layer form being scratched by the non-coated side of the substrate tape.

The system also includes a scalable multi-zone substrate heater for heating by a combination of conduction and radiation a continuously translating substrate in a high-throughput continuous production vapor deposition process. The multi-zone substrate heater of the present invention is suitable for use inside a vapor deposition chamber for depositing, for example, a HTS film on a buffered metal substrate tape translating through the deposition chamber.

In order to optimally reach the desired temperature profile across the entire length of a deposition zone within the deposition chamber, the multi-zone heater embodiment of the present invention includes an arrangement of heating elements that provides multiple temperature zones. Such temperature zones include, for example, a preheating zone providing a maximum temperature of 860° C., a deposition heating zone providing a maximum temperature of 900° C., and a cooling zone providing a maximum temperature of 860° C., where the preheating zone is oriented toward the entry point of the vapor deposition zone and the cooling zone is oriented toward the exit point of the vapor deposition zone.

In another embodiment of the invention, a plurality of deposition heating zones are arranged sequentially between the preheating zone and the cooling zone in a scalable fashion to accommodate process deposition zones of varying length depending on the size of the deposition chamber and/or the desired throughput.

For use in a pulsed laser deposition (PLD) process, the multi-zone heater of the present invention includes passages that enable one or more laser beams to pass unimpeded to one or more targets, which otherwise would be obstructed by the size of such a substrate heater that is necessary to accommodate the increased deposition zone length necessary to a high throughput PLD system. The multi-zone heater also allows for accurate monitoring of the substrate temperature via thermocouples and an optical pathway disposed through its structure that enables a pyrometer to make temperature measurements to the non-coated side of the translating tape.

The system also optionally includes a multi-target manipulator apparatus. The multi-target manipulator apparatus includes a plurality of target manipulators mechanically coupled to one another in a line via a bar or platen. Each target manipulator within the multi-target manipulator apparatus includes a target holder driven by an independent drive motor that provides rotational motion to the target holder via a shaft. Furthermore, the bar or platen connecting the plurality of target manipulators one to another is mechanically coupled to a common variable-speed actuator that provides the oscillatory motion in combination with the rotational motion provided by the respective motors.

In operation, the multi-target manipulator apparatus, having multiple target holders upon which are placed multiple targets, respectively, allows multiple laser beams to impinge simultaneously upon the targets. As a result, multiple plumes of ablated material, to which a substrate is exposed for a predetermined time, are formed, thereby forming a film on the substrate. Furthermore, due to the appropriate spacing between the multiple target manipulators arranged in a line, the resulting plumes slightly overlap one to another and therefore ensure uniformity of film deposition over an expanded deposition zone length.

The multi-target manipulator apparatus of the present invention is especially suitable for use in a multi-laser beam PLD process for the large-scale production of HTS-coated wire.

BRIEF DESCRIPTION OF THE DRAWINGS

FIGS. 2D, 2E, and 2F illustrate the target impingement geometries that are the result of various actions of a conventional target manipulator.

DETAILED DESCRIPTION OF THE INVENTION

Figure 1A:
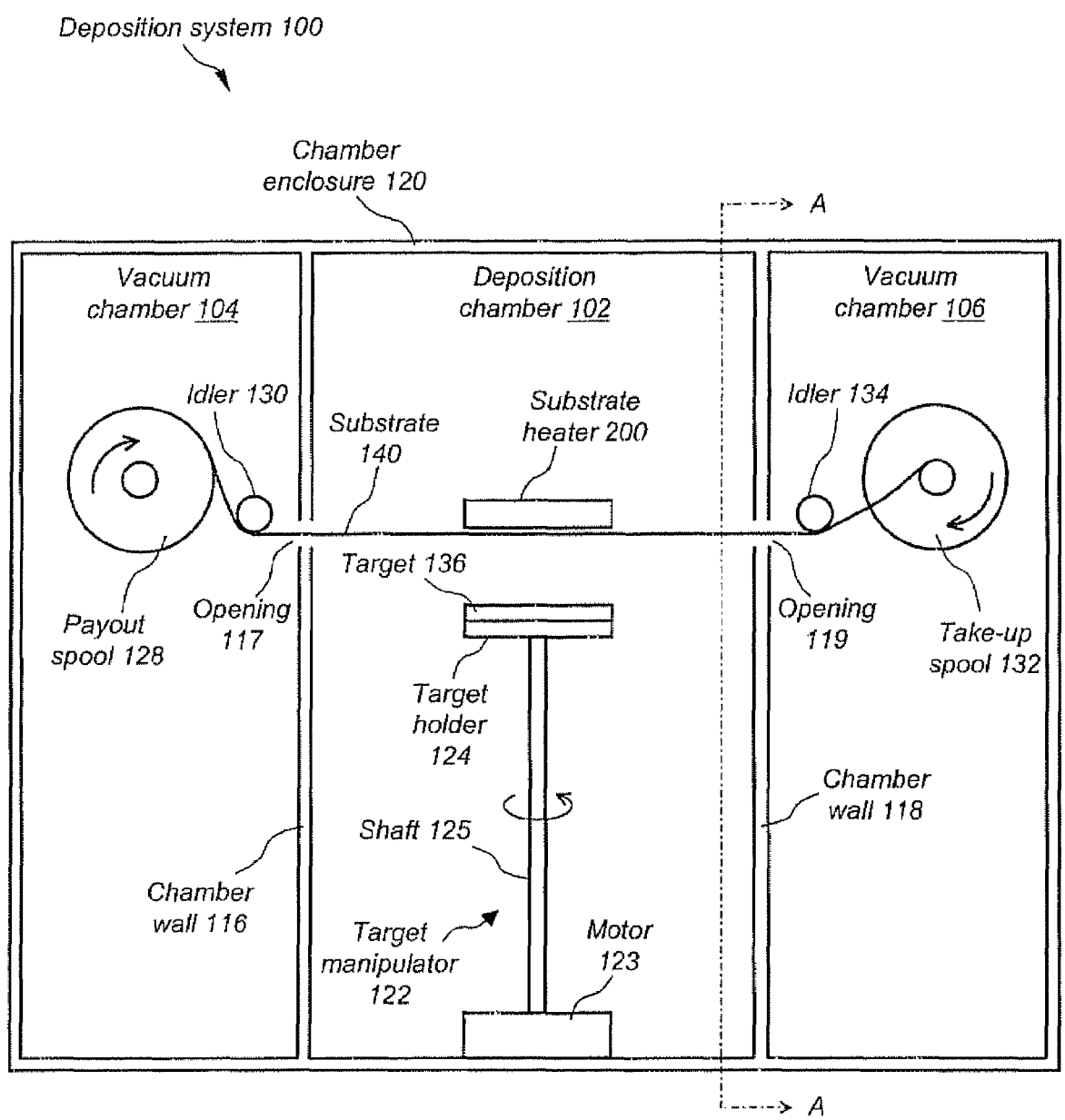
FIG. 1A illustrates a front view of the pulsed laser deposition system of the present invention, in its simplest form, for forming HTS coated tape.
Figure 1B:
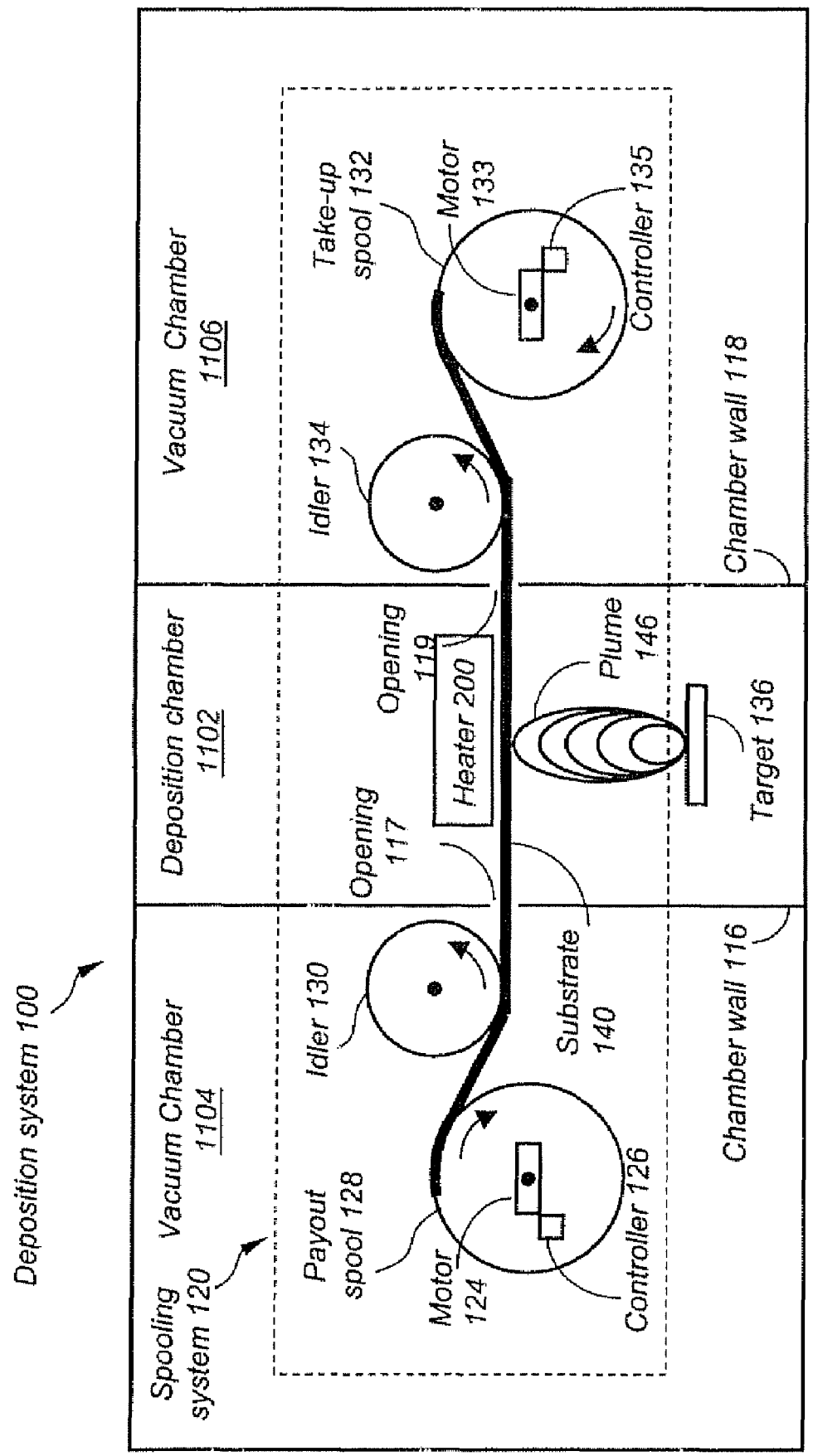
FIG. 1B illustrates a front view of a typical deposition system housing a spooling system in accordance with the invention.

FIGS. 1A and 1B are front views of a PLD system 100 of the present invention in its simplest form. The PLD system 100 includes a main deposition chamber 102 arranged between a first vacuum chamber 104 and a second vacuum chamber 106, where a chamber wall 116 having an opening 117 provides separation and isolation between the deposition chamber 102 and the vacuum chamber 104, and where a chamber wall 118 having an opening 119 provides separation and isolation between the vacuum chamber 106 and the deposition chamber 102. Furthermore, enclosing the deposition chamber 102, the vacuum chamber 104, and the vacuum chamber 106 collectively is a chamber enclosure 120. The openings 117 and 119 provide a passageway through which a translating substrate may travel from one chamber to the next.

The deposition chamber 102 is a chamber designed specifically for pulsed laser deposition applications, such as a 12- or 18-inch vacuum chamber commercially available by Neocera, although those skilled in the art will appreciate that a number of alternative vendors manufacture vacuum chambers in a variety of shapes and sizes that may be implemented as the deposition chamber 102 of the present invention. The surrounding vacuum chambers 104 and 106 may be of a variety of dimensions and serve in the present invention to house elements of the spooling system.

Housed within the deposition chamber 102 are one or more target manipulators, for example, a target manipulator 122 that includes a motor 123 and a target holder 124 mechanically connected via a shaft 125. The target holder 124 is a mount onto which a target 136 composed of HTS material, such as YBCO or cerium oxide ($CeO_2$), depending upon the application, is placed. The target 136 is available commercially from suppliers such as Target Materials, Praxair, and Superconductive Components. In its simplest from, the target manipulator 122 may be one of many off-the-shelf models available to the industry that enables translation and rotation (rastering) of the target 136 and/or target indexing (target selection in multiple target holders) in such a way as to ensure a uniform wearing away of the target 136 during the PLD process and to prevent surface irregularities or undesirable microstructures from developing on the target 136 due to repeated ablation events in localized regions.

Alternatively, to provide maximum throughput, the target manipulator 122 is a multi-target manipulator apparatus suitable to handle multiple instantiations of the target 136 for use in a multi-laser PLD process. In this case, the multi-target manipulator is useful in a multiple or split laser beam PLD system having a single or multi-zone substrate heater. This multi-target manipulator suitably provides the required rotating and variable-speed side-to-side oscillating motion to multiple instantiations of the target 136 simultaneously each having a laser beam impinging upon their surface concurrently, thereby maximizing the deposition zone and thus optimizing the throughput in the continuous production PLD process.

Multiple instantiations of the target holder 124 of the target manipulator 122 are oriented when installed toward a substrate heater 200 that is also housed within the deposition chamber 102. The substrate heater 200 is a heating device used to heat and maintain the temperature of the substrate to within a range of approximately 750 to 900° C. In its simplest form, the substrate heater 200 may be a conductive or radiant heater that is available commercially from vendors such as Thermionics, Thermocoax, Neocera, and PVD Products. However, for the purpose of continuous, long tape deposition, a heater with combined conductive and radiative heat transfer is preferred in order to achieve optimum substrate temperature as the substrate moves through the deposition zone. Alternatively, to provide maximum throughput, the substrate heater 200 is a multi-zone heater. Such a multi-zone heater includes multiple independently controlled and monitored temperature zones (e.g., a preheating zone providing a maximum temperature of 860° C., one or more deposition heating zones each providing a maximum temperature of 900° C., and a cooling zone providing a maximum temperature of 860° C.) arranged sequentially along the axis of the tape translation in order to optimally reach the desired temperatures across the entire length of an expanded deposition zone made possible by the use of a target manipulator 122 suitable to handle multiple instantiations of the target 136 in combination with a multiple or split laser beam PLD system.

Furthermore, in a preferred embodiment, the substrate heater 200 is a scalable multi-zone heater design that includes multiple "deposition heating zones" arranged sequentially along the axis of the tape translation to accommodate process deposition zones of varying length within deposition chamber 102.

The design of the multi-zone heater allows multiple laser beams to pass unobstructed to multiple instantiations of the target 136 and allows for accurate monitoring of the substrate temperature via thermocouples throughout the continuous PLD process.

As shown in more detail in FIG. 1B, housed within the deposition system 100 is the spooling system 120 in accordance with the invention. The spooling system 120 includes a payout spool 128, upon which a substrate tape 140 is wound, having an associated drive motor 124 with an associated controller 126, all housed in the chamber 104 along with an idler 130. The spooling system 120 further includes a take-up spool 132, onto which the substrate tape 140 in the form of HTS-coated tape is wound, having an associated drive motor 133 with an associated controller 135, all housed in the chamber 106 along with an idler 134. The substrate tape 140 laces through the deposition system 100 from the payout spool 128 and then rides on the idler 130 through a opening 117 in the chamber wall 116, and thus passes into the main deposition chamber 102. Once inside the deposition chamber 102, the substrate tape 140 subsequently passes through a deposition zone and then exits the deposition chamber 102 via an opening 119 in the chamber wall 118, and passes into the chamber 106. The non-coated side of the substrate tape 140 subsequently rides on the idler 134 prior to being wound onto the take-up spool 132. The idlers 130 and 134 ensure stable positioning of the substrate tape and also ensure that the proper amount of tension is maintained on the substrate tape, thereby preventing the development of slack. The dimensions of the deposition zone are defined by a target 136, a plume 146, and a substrate heater (not shown). The plume 146 is a plasma cloud resulting from the material of the target 136 melting and subsequently evaporating explosively when impinged upon by a laser beam as is well known in a PLD process.

FIGS. 1A and 1B show the spooling system lacing though a single deposition chamber 102 as one example. However, the spooling system may span a plurality of adjacent chambers.

The payout spool 128 is a reel onto which an extended length of the substrate tape 140 is wound. A typical diameter of the payout spool 128 is eight inches. The payout spool 128 may contain a protective interleaf material wound between the layers of the substrate tape 142 contained thereon for protective purposes. The take-up spool 130 is a reel onto which the substrate tape winds after it is exposed to a pulsed laser deposition process in the deposition chamber 102. A typical diameter of the take-up spool 132 is eight inches. If disposed near the deposition zone, the take-up spool 132 and/or the payout spool 128 may be cooled.

The motors 124 and 133 are connected to the payout spool 122 and the take-up spool 130, respectively. The motors 124 and 133 are identical and serve one of two functions: one motor serves to drive a spool and translate the substrate tape 140 through deposition chamber(s) 102, while the other motor serves to provide a preset amount of tension in the substrate tape. In FIG. 1b, the motor 133 is driving the take-up spool 132 and thus translating the substrate tape 140 through the deposition chamber 102, while the motor 124 is providing a small amount of resistance to the rotation of the payout spool 128, thereby producing a desired amount of tension in translating the substrate tape 140. Certain applications may require the substrate tape 140 to reverse through the deposition chamber 102, e.g., in the case of in situ post deposition annealing, in which case the roles of the motor 124 and the motor 133 are reversed It is for this reason that the motors 124 and 132 are identical and capable of serving dual functions.

The controllers 126 and 135 control the action of the motors 124 and 132, respectively. The controllers 126 and 135 are responsible for maintaining the translation of the substrate tape 140 through the deposition chamber(s) 102 at the optimum speed and proper tension, as well as ensuring a compact winding of the substrate tape 140 onto the take-up spool 130. The controllers 126 and 135 may provide real time information about the tension of the tape 140 to an externally located control source or, alternately, tension may be actively monitored with the use of a tension-sensing device such as a load cell (not shown). Such a load cell mechanism may come into contact with the tape 140 and communicate actively with the controllers 126 and 135 in a feedback loop. The controllers 126 and 135 may then compare the communicated tension with a preset tension value stored within their memories and subsequently adjust the tension of the tape 140 via control of the motor 124 and/or 133.

The idlers 130 and 134 are rotating elements that are in contact with the none-coated side of the substrate tape 140. A typical diameter of the idlers 130 and 134 is between three and five inches. The idlers 128 and 136 maintain the translating substrate tape 140 at a consistent orientation within the deposition zone. The idlers 128 and 136 prevent movement of the substrate tape 142 in any direction except for that of its translation, ensuring the substrate tape 140 is exposed to an optimum portion of the plume 142. A precise distance from the plume 142 (typically two inches) must be maintained to ensure a uniform and consistent deposition of material onto the substrate tape 140. Additionally, it is likely that there may be additional pairs of idlers included in applications in which the spooling system 120 translates the substrate tape 142 through more than one adjacent deposition chambers. The idlers 128 and 136 additionally allow for adjustment in the positioning of the substrate tape 140, as is desirable when it is determined that the substrate-to-target 144 distance must change.

In operation, the payout spool 122 containing the substrate tape 140, which has been exposed to a buffer deposition process such as IBAD, is received from the buffer layer deposition processing area and is mounted in the payout spool 122 location of the spooling system 120. The take-up spool 130 is similarly mounted, and a leader section of tape attached to the take-up spool 130 is laced under the idler 136, through the slit 119, in some cases through a multi-zone substrate heater, through the slit 138, and under the idler 128, and is spot-welded or spliced to the substrate tape 140. The heater is turned on, the motor 132 and the motor 124 are engaged, the substrate tape 140 translates through the deposition chamber 102 at a constant rate of between 10 and 500 meters per hour, and a PLD process occurs that deposits a superconducting layer atop the substrate tape 140.

During translation of the substrate tape 142 (from left to right, as seen in FIG. 1b), the motor 132 drives the take-up spool 130 and causes the substrate tape 140 to translate through the deposition chamber 102. The motor 124 provides a small amount of resistance to the rotation of the payout spool 122 and thereby produces the desired amount of tension in the translating the substrate tape 142. The controller 126 and the controller 135 regulate the actions of the motor 124 and the motor 132, respectively, ensuring that the motors 124 and 133 translate the substrate tape 142 through the deposition chamber 102 at a constant speed and optimum tension. The tension may be monitored actively by the controllers 126 and 135 or by a tension-sensing device such as a load cell that is in communication with the controllers 126 and 135. The motor 124 and the motor 133 are identical and are capable of translating the substrate tape 140 through the deposition chamber 102 in reverse, as certain applications such as post-deposition in situ annealing demand such features. Additionally, the motor 124 and the motor 133 may include tension-controlling devices such as clutches that control the torque imparted to the take-up spool 132 and the payout spool 128. Such clutches are elements well known to the art. The idlers 128 and 136 maintain the translating substrate tape 142 at a constant height through the deposition chamber 102, ensuring an optimum substrate deposition temperature as the substrate tape 140 translates through or near a substrate heating element, as well as ensuring a uniform and consistent deposition of material onto the substrate tape 140 by maintaining the optimum substrate-to-target 136 distance (typically two inches). Additionally, the idlers 130 and 134 help to prevent any lateral motion or the formation of twists in translating substrate tape 140.

The substrate tape 140 winds onto the take-up spool 132 such that the HTS-coated side of the substrate tape 140 is oriented toward the center of the take-up spool 132. The ceramic film deposited on the substrate tape 140 is less likely to be damaged when under compressive stress than when under tensile stress, as the ceramic grains atop the substrate tape 140 may fracture when bent beyond a certain strain, resulting in a decrease in the critical current-carrying capacity of the finished superconductor tape. As an additional protective measure, a length of polymer interleaf may be wound into the take-up spool 132 between layers as the substrate tape 140 winds onto the take-up spool 132, protecting the superconducting layer of the substrate tape 140 from being scratched by the non-coated side of the substrate tape 140. Polymer interleaf layers may also be included in the payout spool 128 and collected by a collector spool as the substrate tape 140 rolls off the payout spool 128. Additionally, the substrate tape 140 may undergo silver sputtering in a chamber adjacent to the deposition chamber 102 before winding onto the take-up spool 132 to provide a protective coating to the substrate tape 140.

The substrate tape 140 is an extended length of buffered substrate that may have dimensions of one centimeter in width and upwards of one hundred meters in length. An example of the substrate 140 is a buffered metal (e.g., polycrystalline nickel alloy) tape. In the case of a buffered metal tape, the substrate 140 is composed of for example, Hastelloy, Inconel, or stainless steel that has been cleaned and polished and measures, for example, between 25 and 100 microns in thickness, with, for example, a yttria-stabilized zirconia (YSZ), cerium oxide ($CeO_2$) or magnesium oxide (MgO) buffer layer deposited thereon by one of several well-known deposition techniques, such as ion beam assisted deposition (IBAD). Optionally, the substrate 140 may include "dummy tape," or a length of non-processed substrate, at both ends to allow easier lacing through the multi-laser beam PLD system 100 and easier subsequent handling.

Figure 2A:
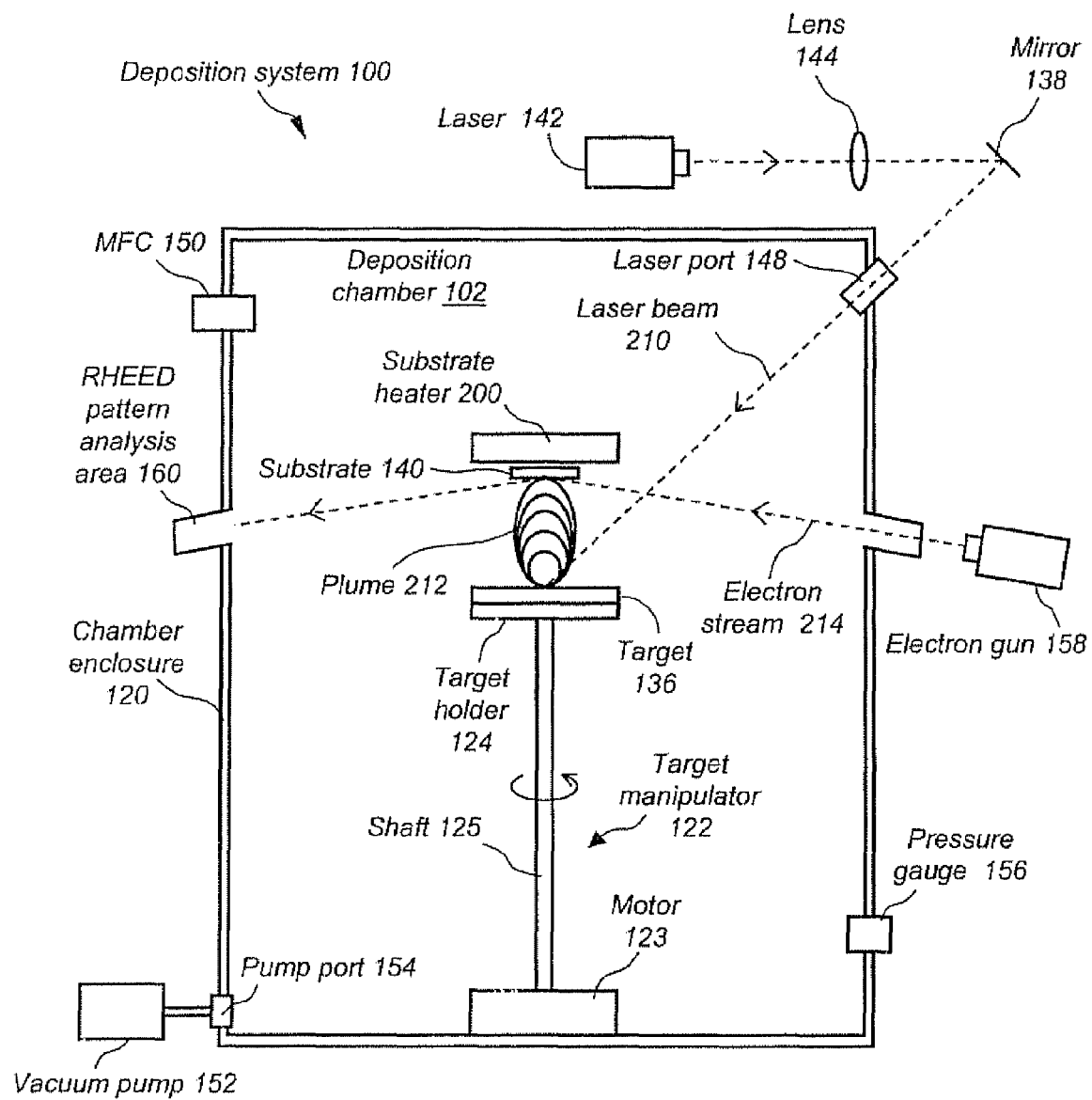
FIG. 2A illustrates a cross-sectional view of the pulsed laser deposition system of the present invention in operation, taken along line AA of FIG. 1.

FIG. 2A shows a cross-sectional view of the PLD system 100 in operation, taken along line AA of FIG. 1A. As shown in FIG. 2A, it is evident that the PLD system 100 of the present invention further includes a laser 142 such as a Lambda Physik model STEEL 670 Excimer laser, characterized by stabilized average power of 200 watt and a pulse repetition rate up to 300 Hz. Those skilled in the art, however, will readily perceive that a variety of lasers may enable the practice of this present invention.

In operation, the laser 142 emits a pulsed laser beam 210 that subsequently passes through a commercially available adjustable focus optical lens 144 and then reflects off a mirror 146 that is a light-reflecting surface available commercially from suppliers such as Roper Scientific. The PLD system 100 includes a laser port 148 that has a quartz window through which the laser beam 210 enters into the deposition chamber 102. Because a laser beam, such as the laser beam 210, is operating continuously during the PLD process, contaminate particles of the target material may tend to cloud the laser window within the laser port 148 over time. Thus, in the preferred embodiment, the laser port 148 includes a laser beam delivery system that monitors and automatically maintains a laser beam 210 of constant energy by monitoring the intensity of the laser beam 210 via sensors and feeding back to a controller such that the laser 142 power level may be adjusted up or down accordingly.

A plume 212 is a plasma cloud resulting from the material of the target 136 melting and subsequently evaporating explosively when impinged upon by the laser beam 210.

The PLD system 100 further includes various controls and monitoring devices, such as a mass flow controller (MFC) 150 that regulates the mass of gas that enters the deposition chamber 102; a vacuum pump 152 mounted to the deposition chamber 102 via a pump port 154 in chamber wall 120, where the vacuum pump 152 may be a combination of a mechanical pump and a turbo-molecular pump and functions to assist in controlling the pressure inside the deposition chamber 102 and purging gas from the deposition chamber 102, and where the pump port 154 also acts as the outlet through which gas is purged from the deposition chamber 102; a pressure gauge 156 that is a pressure-sensing device, such as a capacitance monometer, a hot cathode, a cold cathode, a convectron, or a number of other applicable instruments; and an electron gun 158 that during operation emits an electron stream 214 into the deposition chamber 102 and onto the deposited HTS layers of the substrate 140 at a grazing angle less than five degrees. The electron stream 214 impinges on the layers deposited on the substrate 140 and is diffracted and analyzed at a RHEED pattern analysis area 160. The RHEED pattern analysis area 160 is an analysis area at which a diffraction pattern is produced due to the interaction of the incident electron stream 214 and the crystalline arrangement of the surface of film deposited onto the substrate 140. RHEED diffraction patterns, often represented by an Ewald sphere, are produced when the momentum of incident electron stream 214 and that of the diffracted electron beam differ by a reciprocal lattice vector of the deposition surface, and are used to monitor the growth, crystallinity, and crystal orientation of the film (layers deposited onto the substrate 140) in situ. Additionally, other in situ monitoring tools that may be incorporated into the PLD system 100 include a helium neon (HeNe) laser with a HeNe pass filter and photodiode, an X-ray diffractometer system, or an X-ray fluorescence system.

With continued reference to FIGS. 1A and 2A, the operation of the PLD system 100 in its simplest form (i.e., one laser beam 210 impinging on one target 136 forming one plume 212) is as follows. The payout spool 128, on which is wound a length of substrate 140 that is coated with a buffer layer as received from the buffer processing area, is mounted within the vacuum chamber 104. The substrate 140 is laced through the openings 117 and 119 in the chamber walls 116 and 118, respectively, and onto the take-up spool 132 in vacuum chamber 106, all the while being in contact with the idlers 130 and 134 to prevent any slack from developing in the length of the substrate 140. Additionally, the idlers 130 and 134 are set such that the substrate 140 is a predetermined distance from the target 136. A typical distance of the substrate 140 from the target 136 is approximately two inches.

The target 136 is mounted to the target holder 124 within the vacuum environment of the deposition chamber 102 in close proximity to the substrate 140, onto which the evaporant material, such as YBCO, is to be deposited.

The vacuum environment of the deposition chamber 102 is developed by the vacuum pump 152 and monitored by the pressure gauge 156. Oxygen is pumped into the deposition chamber 102 via the MFC 150. The substrate 140 is heated to an optimal deposition temperature between 500 and 900° C., preferably between about 750 and about 830° C., by the radiant substrate heater 200. The pulsed laser beam 210, which is generated by the laser 142 located outside the deposition chamber 102, is focused by the lens 144, reflects off the mirror 146, and is directed into the deposition chamber 102 through the laser port 148 to impinge upon a portion of the target 136, causing the formation of the plume 212, which emanates from that portion of the target 136 radiated by the laser beam 210 toward the substrate 140 in a highly forward-directed fashion. The particles contained in the plume 212 are thus deposited onto the surface of the substrate 140 as the tape translates through the deposition chamber 102 at a predetermined speed controlled by the rotational speed of the take-up spool 132.

The target 136 is rastered, or rotated and translated, by the target manipulator 122 during the laser impingement events to prevent undesirable microstructures (cones) from developing on the surface of the target 136 and, further, to assure an even wearing away of the target 136. As the HTS coated tape formed by the PLD process exits the deposition chamber 102 through the opening 119 in the chamber wall 118, it may optionally undergo silver sputtering in an adjacent chamber to provide a protective coating. Alternately, a protective film may wind onto the take-up spool 132 as the superconducting tape winds onto the take-up spool 132 to provide a protective barriers.

As the deposition process occurs, the in situ monitoring tools as described in FIG. 2A are used to monitor the growth, crystallinity, crystal orientation, and thickness of the film being deposited onto the substrate 140.

The deposition chamber 102 may additionally include several extra ports for user diagnostics or other applications, including, but not limited to, target and substrate view ports, ports for atomic absorption or emission spectroscopy, and a pair of ports for if situ ellipsometry.

To provide a PLD system 100 that is highly optimized for the continuous, high throughput production of HTS wire, the translation rate of the substrate 140 through the PLD system 100 is increased by expanding the length of the deposition zone in the following manner. In an alternative embodiment that achieves all expanded length deposition zone, the PLD system 100 of the present invention includes multiple instantiations of the laser beam 210 for impinging upon multiple instantiations of the target 136 arranged sequentially along the axis of the tape translation, thereby forming multiple instantiations of the plume 212 simultaneously to which the substrate 140 is exposed. The multiple instantiations of the target 136 are mounted onto the target manipulator 122 that suitably designed to handle the multiple instantiations of the target 136. The multiple instantiations of the plume 212 are arranged sequentially along the axis of the tape translation and are slightly overlapping, thereby forming an expanded length deposition zone wherein the substrate 140 is exposed to the evaporant material. Furthermore, this expanded deposition zone provides a film deposition uniformity within +/−5%. The thickness of the HTS film deposited onto the substrate 140 is controlled by the rotational speed of the take-up spool 132, thereby controlling the time that the substrate 140 is present in the deposition zone.

Multiple instantiations of the laser beam 210 may be supplied by multiple instantiations of the laser 142, respectively, or by a single laser 142 having a laser output that is split into multiple instantiations of the laser beam 210 by optical devices that perform well-known laser splitting functions. In this case, the intensity of the laser beam from the laser 142 is sufficiently powerful, when split, to supply the energy to multiple instantiations of the laser beam 210 required for a PLD process.

With continued reference to FIGS. 1A and 2A, the operation of this alternative embodiment of the PLD system 100 (i.e., multiple instantiations of the laser beam 210 impinging on multiple instantiations of the target 136 forming multiple instantiations of the plume 212 simultaneously) is as follows. The substrate 140 is laced through the deposition chamber 102 from the payout spool 128 to the take-up spool 132 as described previously. The idlers 130 and 134 are set such that the substrate 140 is a predetermined distance from the multiple instantiations of the target 136. A typical distance of the substrate 140 from the targets 136 is approximately five centimeters [two inches].

Multiple instantiations of the target 136 are mounted to multiple instalntiations of the target holder 124, respectively, of the target manipulator 122 within the vacuum environment of the deposition chamber 102 in close proximity to the substrate 140, onto which the evaporant material, such as YBCO, is to be deposited. The substrate 140 is heated by convection to an optimal deposition temperature between 500 and 900° C., preferably between about 750 and about 830° C., by the substrate heater 200 that in this embodiment is a radiant multi-zone substrate heater. Multiple instantiations of the pulsed laser beam 210 are focused by multiple instantiations of the lens 144, reflecting off multiple instantiations of the mirror 146, and are directed into the deposition chamber 102 through the multiple instantiations of the laser port 148. The target manipulator 122 suitably provides the required rotating and variable-speed side-to-side oscillating motion to multiple instantiations of the target 136 simultaneously, each having a laser beam 210 impinging upon their surface concurrently, causing the formation of multiple instantiations of the plume 212, which overlap and emanate toward the substrate 140, thereby maximizing the deposition zone and thus optimizing the throughput in the continuous production PLD process. The particles produced by multiple instantiations of the plume 212 are thereby deposited onto the surface of the substrate 140 as the tape translates through the deposition chamber 102 at a predetermined speed controlled by the rotational speed of the take-up spool 132.

Several key observations can be made regarding the multiple laser beam\target\plume arrangement of the PLD system 100 of the present invention:

For a given HTS film thickness, an increase in throughput is achieved that is directly proportional to the number of laser beams and targets operating simultaneously (i.e., thereby forming multiple plumes), as compared with a single laser beam system (i e., a single plume).

Alternatively, for a given substrate translation speed, an increase in HITS film thickness is achieved that is directly proportional to the number of laser beams and targets operating simultaneously (i.e., thereby forming multiple plumes), as compared with a single laser beam system (i.e., a single plume).

High throughput is achieved without sacrificing the uniformity of the deposited material.

Figure 3:
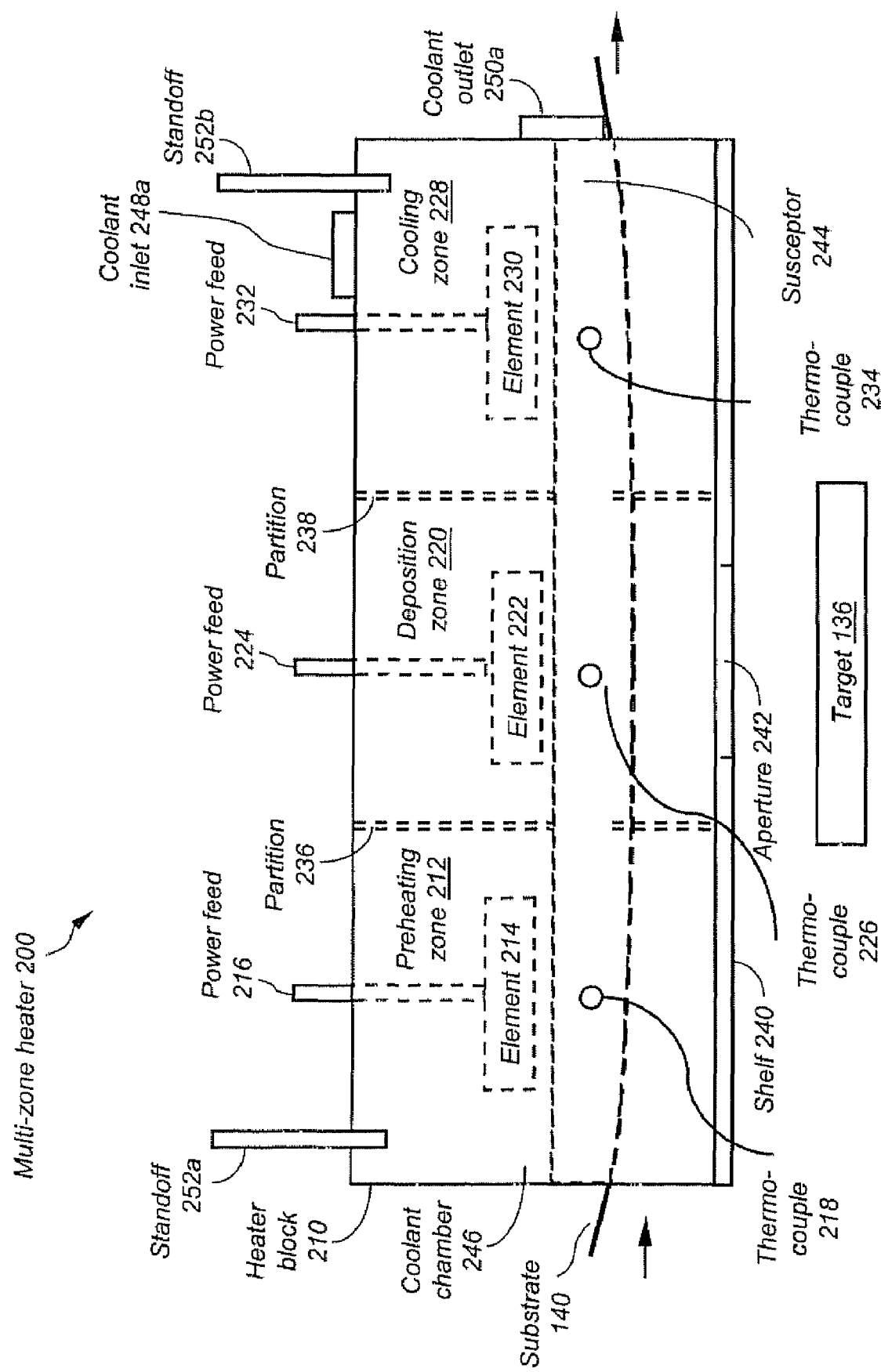
FIG. 3 illustrates a side view of a multi-zone substrate heater in its simplest form for use in a vapor deposition process for forming HTS-coated wire.

FIG. 3 illustrates a side view of a multi-zone heater 250 in accordance with the invention, in its simplest form, for use in a vapor deposition process for forming HTS-coated wire. Additionally, FIG. 4 illustrates an end view of the multi-zone heater 250 of FIG. 3.

Figure 4:
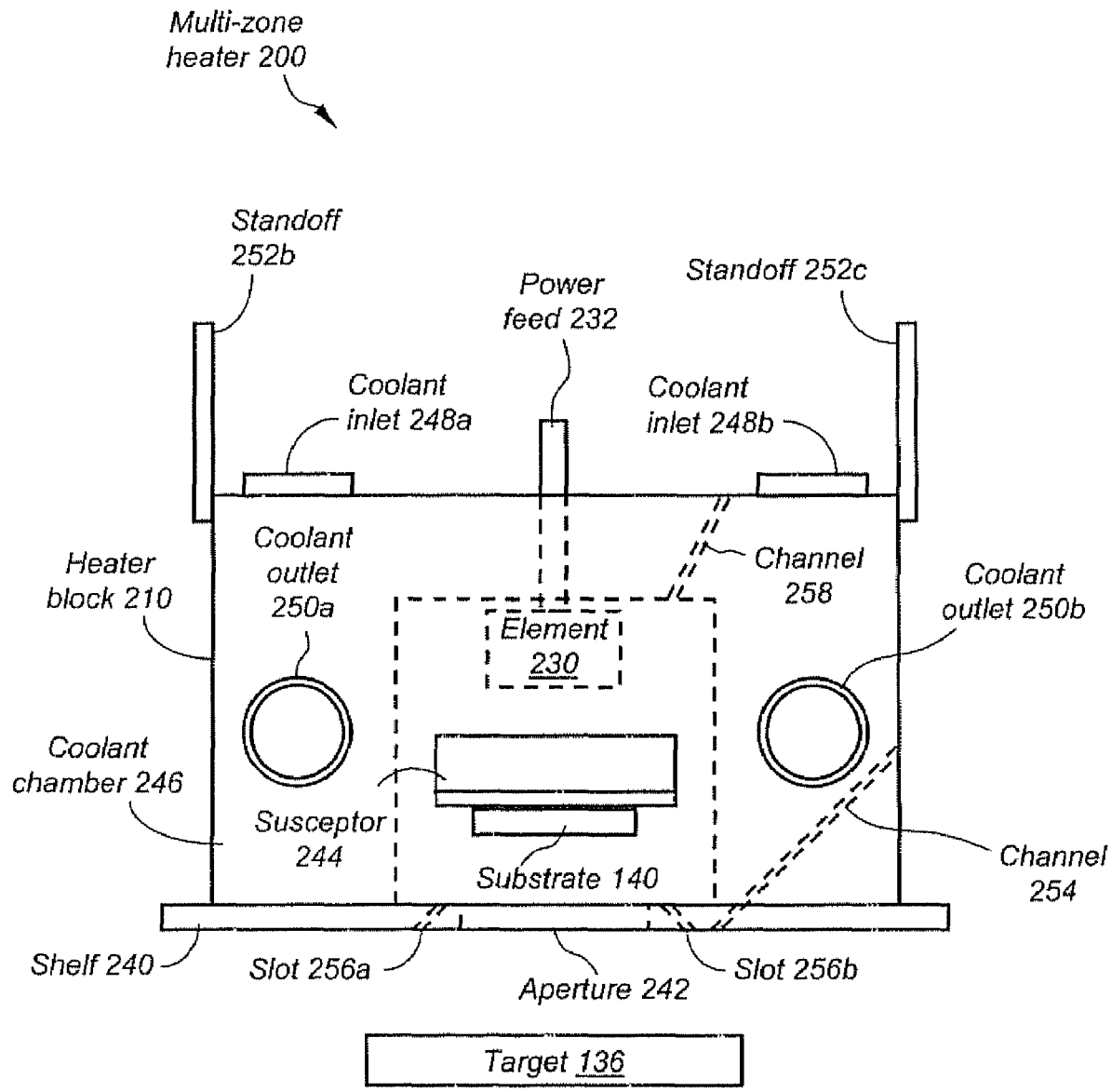
FIG. 4 illustrates an end view of the multi-zone substrate heater of FIG. 3.

With references to FIGS. 3 and 4, the multi-zone heater 250 of the present invention includes a heater block 210 that forms the main body of the multi-zone heater 250. A first heating zone formed within the heater block 210 is a preheating zone 212 having a radiant heating element 214, such as a lamp, fed by a power feed 216. The power feed 216 is electrically connected to an external controller (not shown) for controlling the power level of the heating element 214 and thereby control its temperature based on feedback to the external controller via a conventional thermocouple 118 that provides temperature measurements from within the preheating zone 212. The heating element 214 within the preheating zone 212 is typically capable of providing a maximum temperature of 860° C.

A second heating zone formed within the heater block 210 is a deposition zone 220 having a radiant heating element 222, such as a lamp, fed by a power feed 124. The power feed 124 is electrically connected to the external controller for controlling the power level of the heating element 222 and thereby control its temperature based on feedback to the external controller via a conventional thermocouple 226 that provides temperature measurements from within the deposition zone 220. The heating element 222 within the deposition zone 220 is typically capable of providing a maximum temperature of 900° C.

Lastly, a third heating zone formed within the heater block 210 is a cooling zone 228 likewise having a radiant heating element 230, such as a lamp, or a resistive heating element such as molybdenum disilicide or silicon carbide or nickel-iron alloys such as Kanthal, fed by a power feed 232. The power feed 232 is likewise electrically connected to the external controller for controlling the power level of the heating element 230 and thereby control its temperature based on feedback to the external controller via a conventional thermocouple 234 that provides temperature measurements from within the cooling zone 228. The heating element 230 within the cooling zone 228 is typically capable of providing a maximum temperature of 860° C.

A partition 236 provides the physical and thermal boundary between the preheating zone 212 and the deposition zone 220. Likewise, a partition 238 provides the physical and thermal boundary between the deposition zone 220 and the cooling zone 228. The length of the preheating zone 212, the deposition zone 220, and the cooling zone 228 each measures typically between 6.25 and 7.5 cm [2.5 and 3.0 inches]. Alternatively, the length of each zone can be changed by rearranging the thermal element connection according to requirements. In operation, the maximum $\Delta T$ between the preheating zone 212 and the deposition zone 220, and between the cooling zone 228 and the deposition zone 220 is typically 200° C., and the overall temperature stability of the heating zones is +/−5° C.

A shelf 240 forms the base of the multi-zone heater 200. Disposed within the shelf 240 is an aperture 242 that is positioned within the deposition zone 220. More specifically, the aperture 242 is a window that during the deposition process opens briefly to allow a plume of ablated material to reach a substrate 140 to which the aperture 242 is precisely aligned as the substrate 140 translates through the deposition zone 220. The substrate 140 is, for example, a buffered metal (e.g., polycrystalline nickel alloy) tape, depending upon the application.

A susceptor 244 is arranged along the entire length of the multi-zone heater 200, in contact with which the substrate 140 translates in close proximity to the heating elements 214, 222, and 230. The susceptor 244 provides a support for the substrate 140 as it travels through the deposition zone. The main role of the susceptor 244 is to provide a good heat transfer to the substrate 140 so as to maintain a uniform temperature profile in the deposition zone. The susceptor 244 is typically as long as the heater itself and wide enough to cover the entire deposition zone The thickness of the susceptor 244 is between 5 mm and 35 mm, preferably between 10 mm and 20 mm. The susceptor 244 is formed of a material, such as hastelloy or inconel or silicon carbide, that can conduct heat as well as transfer infrared radiation from the heating elements 214, 222, and 230 to the substrate 140. The susceptor 244 must be capable of withstanding the operating temperatures of the deposition process. To enable good thermal conduction, the susceptor is manufactured with a large radius of approximately 5 to 10 m. This radius enables the tape to be taut against the susceptor. The susceptor is thermally stable so that it does not deform when exposed to the high temperatures. Any deformation will prevent good contact between the substrate and the susceptor. Lastly, the susceptor 244 prevents the plume from contacting the inner components of the multi-zone heater 200.

A coolant chamber 246 formed within the heater block 210 provides containment for a coolant, such as water, to flow within the heater block 210. The coolant is necessary to prevent thermal diffusion from the multi-zone heater 200 to other elements within the deposition chamber. The coolant enters the coolant chamber 246 via a plurality of coolant inlets 248 and exits via a plurality of coolant outlets 250.

The multi-zone heater 200 is suitable to operate inside a deposition chamber, such as a PLD chamber, and thus is secured within the chamber via a plurality of standoffs 252. Lastly, and with reference to FIG. 4, several free space paths within the multi-zone heater 200 are provided to either the target 136 or the substrate 140. More specifically, a channel 254 provides a free space optical path for an external pulsed laser beam directed at the target 136 during the deposition process. The required incident angle of the laser onto the target 136 is typically 45 degrees. Multiple slots 256, for example slots 256a and 256b, provide a free space path to the deposition side of the substrate 140, thereby allowing Fourier Transform Infrared (FTIR) spectroscopy analyses of the substrate 140 during the deposition process. FTIR measurements yield information about both the temperature of the substrate 140 and the thickness and uniformity of the film being deposited on the substrate 140. A channel 258 is a free space path for the sensing mechanism of a pyrometer (not shown), a non-contact temperature-sensing device for monitoring the temperature of the non-deposition side of the substrate 140.

With continued reference to FIGS. 3 and 4, the operation of the multi-zone heater 200 in its simplest form is as follows. The multi-zone heater 200 is mounted within a deposition chamber, such as a PLD chamber, in such a way that the preheating zone 212 is oriented toward the entry point of the vapor deposition chamber and, conversely, the cooling zone 228 is oriented toward the exit point of the vapor deposition chamber. The substrate 140 is fed into the deposition chamber, passing through the heater block 210 of the multi-zone heater 200 of the present invention via the cavity formed by the shield 244.

The temperature of the preheating zone 212 is set typically to between 750 and 830° C. via the element 214 under the control of the external controller connecting to the power feed 216. The temperature of the deposition zone 220 is set typically to about 850° C. via the element 222 under the control of the external controller connecting to the power feed 124.

Lastly, the temperature of the cooling zone 228 is set typically to between 750 and 830° C. via the element 230 under the control of the external controller connecting to the power feed 232.

Thermocouples 218, 226, and 234 are placed in holes drilled in the body of the susceptor 244 itself and provide continuous temperature measurement feedback to the external controller such that the power level of the elements 214, 222, and 230, respectively, may be adjusted upon the detection of any temperature fluctuations during the deposition process, thereby maintaining the desired temperature within each zone. By placing the thermocouples in body of the susceptor, a better temperature stability can be maintained.

The substrate 140 translates along the length of the multi-zone heater 200 in a flow direction from the preheating zone 212 to the deposition zone 220 and finally exiting through the cooling zone 228. The tension and translation speed of the substrate 140 are maintained in a controlled fashion to achieve proper film uniformity and thickness.

The preheating zone 212 raises the temperature of the substrate 140 to between 750 and 830° C., preparing it for the deposition zone 220. Once inside the deposition zone 220, the temperature of the substrate 140 rises further to about 850° C. and a film of HTS material is deposited onto the substrate 140 via exposure to a plume of PITS material.

The plume of HTS material is generated by a pulsed laser beam impinging on the surface of the HTS target 136 via channel 254 where the plume of PITS material enters the multi-zone heater 200 via the aperture 242 that is synchronized with the pulsed laser beam impinging on the target 136. Having passed through the deposition zone 220, the translating substrate 140 passes into the cooling zone 228 where the temperature is lowered to between 750 and 830° C., preparing the substrate 140 to exit the deposition chamber.

Slots 256a and 256b provide unobstructed paths to the deposition surface of the substrate 140 to accommodate FTIR spectroscopy analyses throughout the deposition process. The FTIR spectroscopy yields information about the temperature, the thickness, and the uniformity of the film being deposited on the substrate 140. Likewise, the channel 258 provides an unobstructed path to the non-deposition surface of the substrate 140 so that the pyrometer (not shown) may monitor the temperature of the non-deposition surface of the substrate 140. Lastly, coolant continuously circulates through the coolant chamber 246 via the coolant inlets 248 and the coolant outlets 250 and thereby maintains the temperature of the heater block 210 and associated hardware at an acceptable level to prevent damage due to excessive heating.

Alternatively, it is noted that the multi-zone heater 200 of the present invention is not limited to a single preheating zone 212, deposition zone 220, and cooling zone 228, as shown in FIG. 1. The multi-zone heater 200 of the present invention is scalable to any number of preheating zones 212, deposition zones 220, and cooling zones 228. For example, to support a high-throughput manufacturing process for the continuous flow production of HTS-coated wire, an expanded deposition region is beneficial. Such an expanded deposition region is, for example, between about 25 and 65 cm [10 and 25 inches], preferably between about 30 and 37.5 cm [12.5 and 15.0 inches] in length. In this embodiment, the multi-zone heater 200 is a scalable multi-zone heater design that includes multiple deposition zones 220 arranged sequentially to accommodate process deposition regions of varying length within a deposition chamber, where the deposition chamber has multiple targets 136 with multiple laser beams impinging simultaneously on their respective surfaces, thereby exposing the substrate 140 to multiple overlapping plumes of HTS material simultaneously along the length of this expanded deposition region via multiple apertures 242.

Figure 2B:
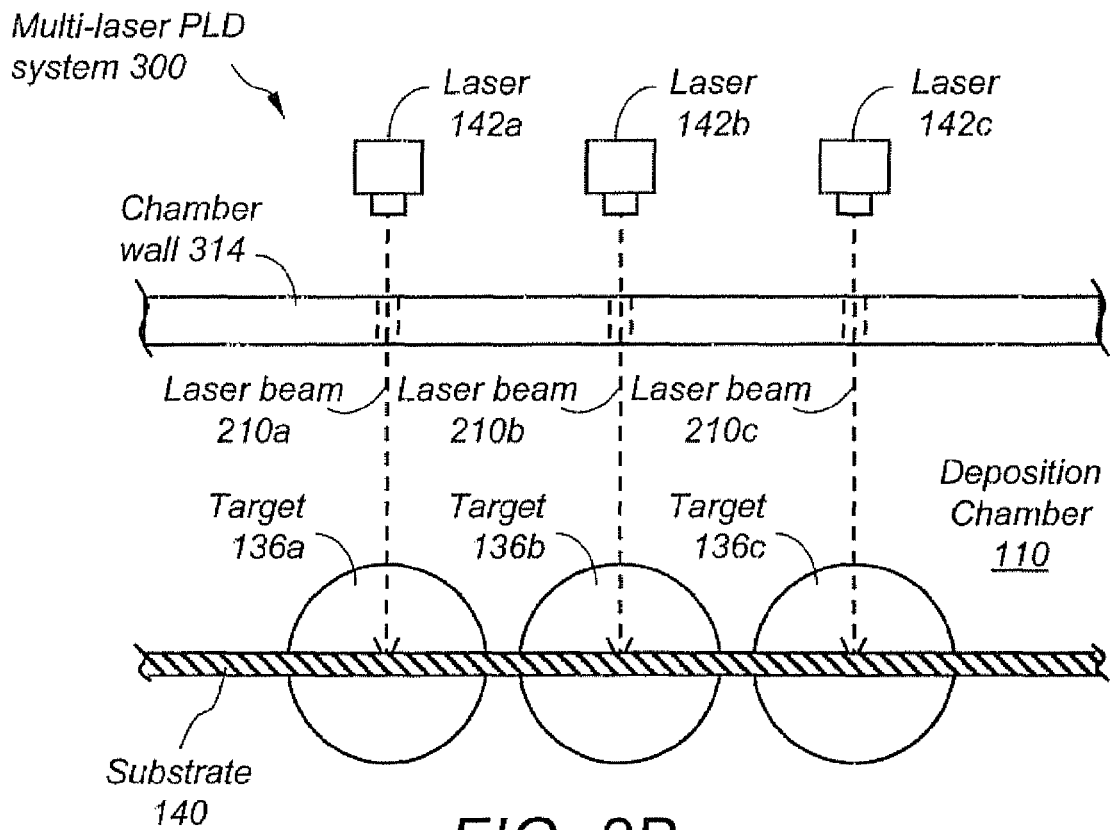
FIG. 2B illustrates a top view of a broad representation of a multi-laser beam PLD system to which the multi-target manipulator apparatus of the present invention is suited.
Figure 2C:
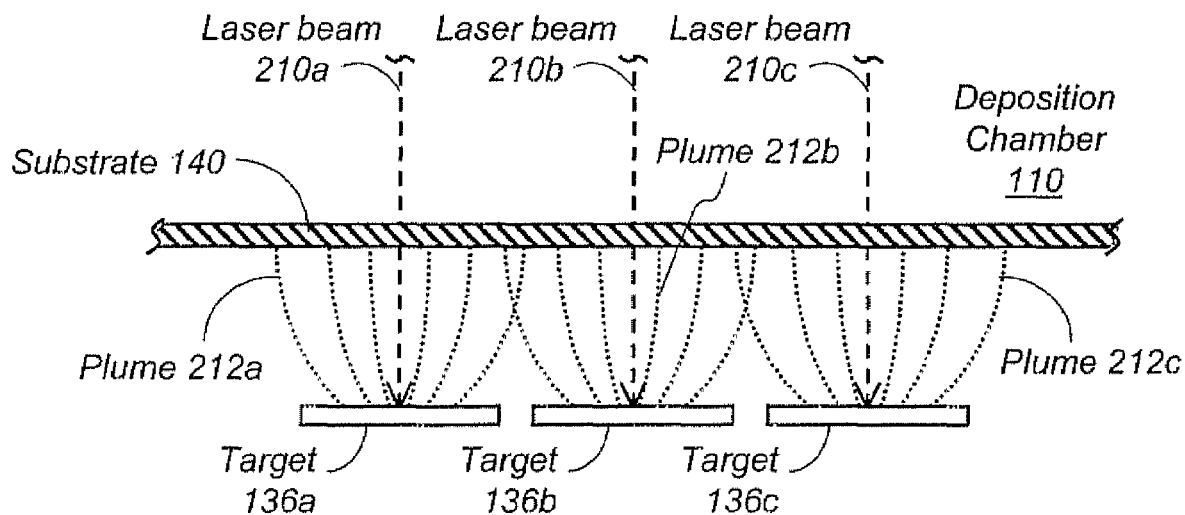
FIG. 2C illustrates a side view of the multi-laser beam PLD system.

FIGS. 2B and 2C illustrate a top view and side view, respectively, of an embodiment of the present invention utilizing a multi-laser beam PLD system in conjunction with the multi-target manipulator apparatus of the present invention. A multi-laser PLD system 300 broadly represents the operation of a multi-laser beam PLD system. Although FIGS. 2B and 2C illustrate a multi-laser PLD application, the system is also suited for use with a split laser beam PLD system.

FIGS. 2B and 2C illustrate the multi-laser PLD system 300, which includes a plurality of lasers 142 (e.g., a laser 142a, a laser 142b, and a laser 142c) producing a plurality of laser beams 210 (e.g., a laser beam 210a, a laser beam 210b, and a laser beam 210c), respectively, that pass through a chamber wall 316 via windows and strike a plurality of targets 136 (e.g., a target 136a, a target 136b, and a target 136c), respectively, at an angle within a PLD chamber. The lasers 142 are, for example, Lambda Physik model LPX 308i lasers, characterized by a medium to high duty cycle with a pulse repetition rate up to 100 Hz. Alternative examples of the lasers 142 are Lambda Physik model STEEL 670 or STEEL 1000 Excimer lasers, capable of pulse repetition rates up to 350 Hz.

In the case of a PLD system for continuous production of HTS-coated tape, the targets 136 are composed of HITS material, such as yttrium-barium-copper-oxide ($YBa_2Cu_3O_7$ or "YBCO") or cerium oxide ($CeO_2$), depending upon the application. The targets 136 are available commercially from suppliers such as Target Materials, Praxair, and Superconductive Components.

In operation, the lasers 142a, 142b, and 142c producing the laser beams 210a, 210b, and 210c, respectively, that pass though their respective windows in the chamber wall 316 and strike the targets 136a, 136b, and 136c, respectively, as illustrated in FIG. 2B. As a result, multiple plumes 212 (e.g., a plume 212a, a plume 212b, and a plume 212c) of ablated material (plasma) are formed simultaneously, as illustrated in FIG. 2C. In the example of FIGS. 2B and 2C, the plumes 212a, 212b, and 212c are deposited simultaneously on a substrate 140 due to the simultaneous action of laser beams 210a, 210b, and 210c impinging on the targets 136a, 136b, and 136c, respectively, which are located in close proximity to the substrate 140, typically about five centimeters [two inches].

The targets 136a, 136b, and 136c are spaced in such a way as to obtain the desired plume overlap, and hence provide a uniform deposition over an expanded length of the substrate 140.

Figure 5A:
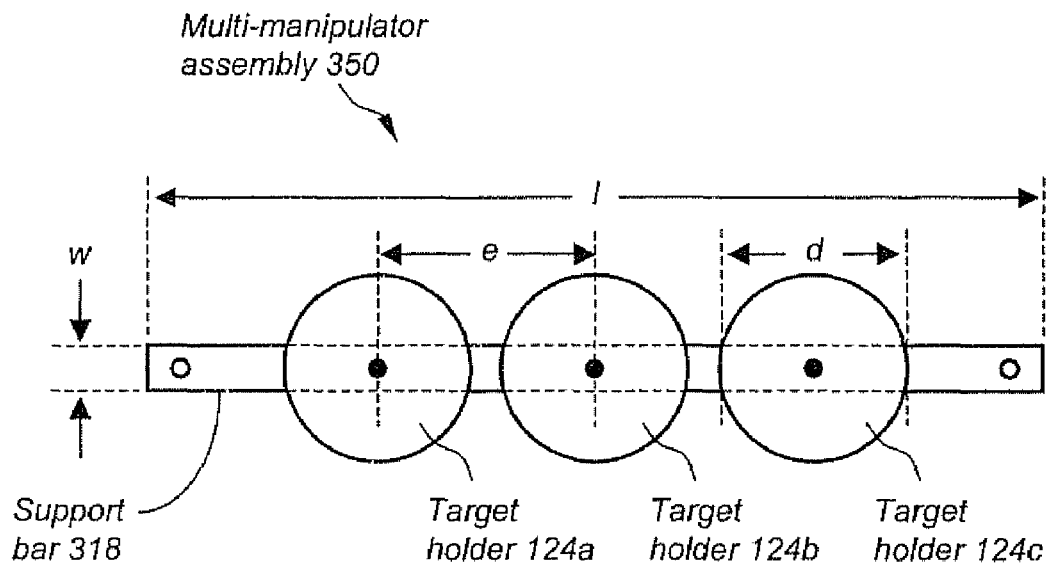
FIGS. 5A and 5B illustrate a top and side view, respectively, of a first embodiment of the multi-target manipulator apparatus of the present invention.
Figure 5B:
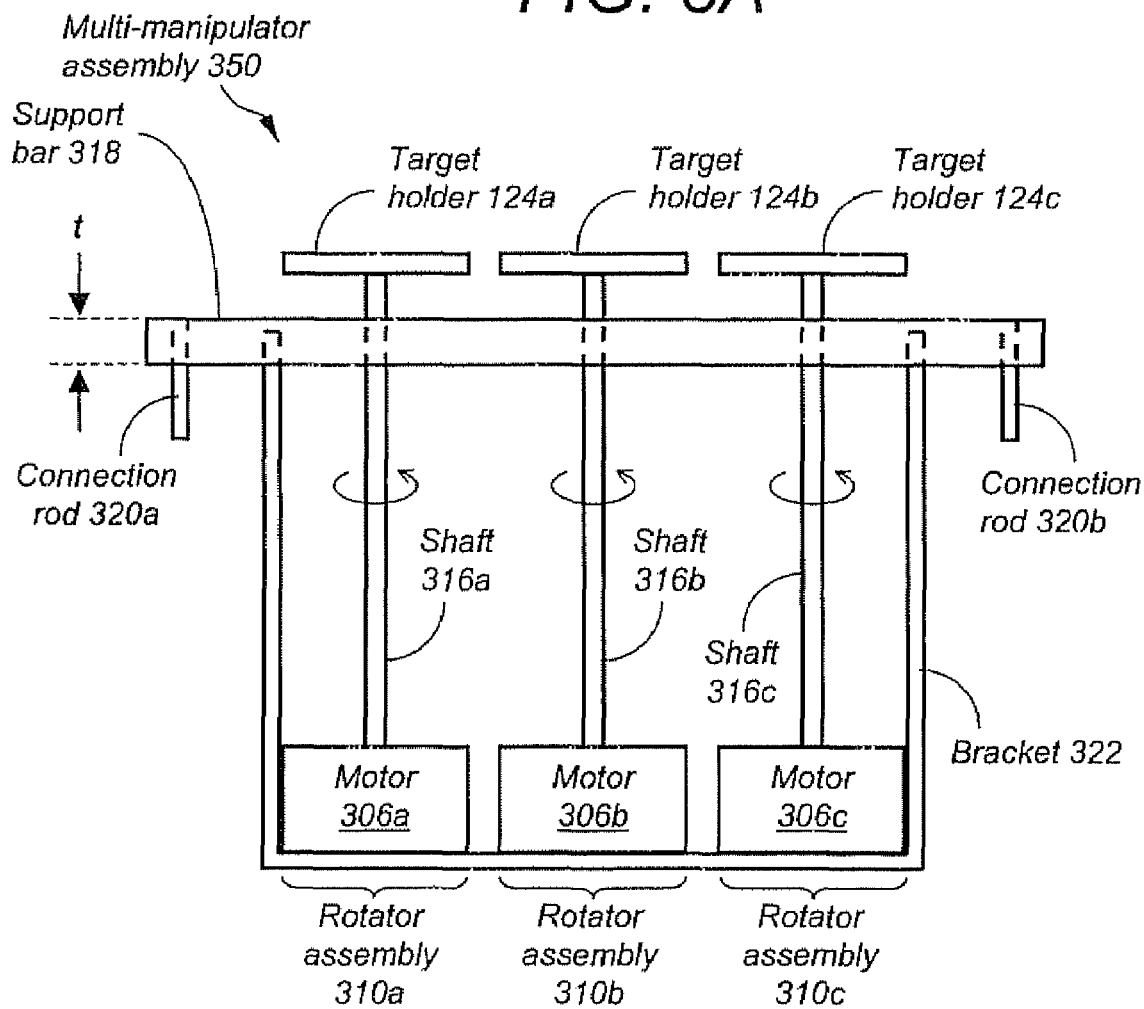
Figure 6A:
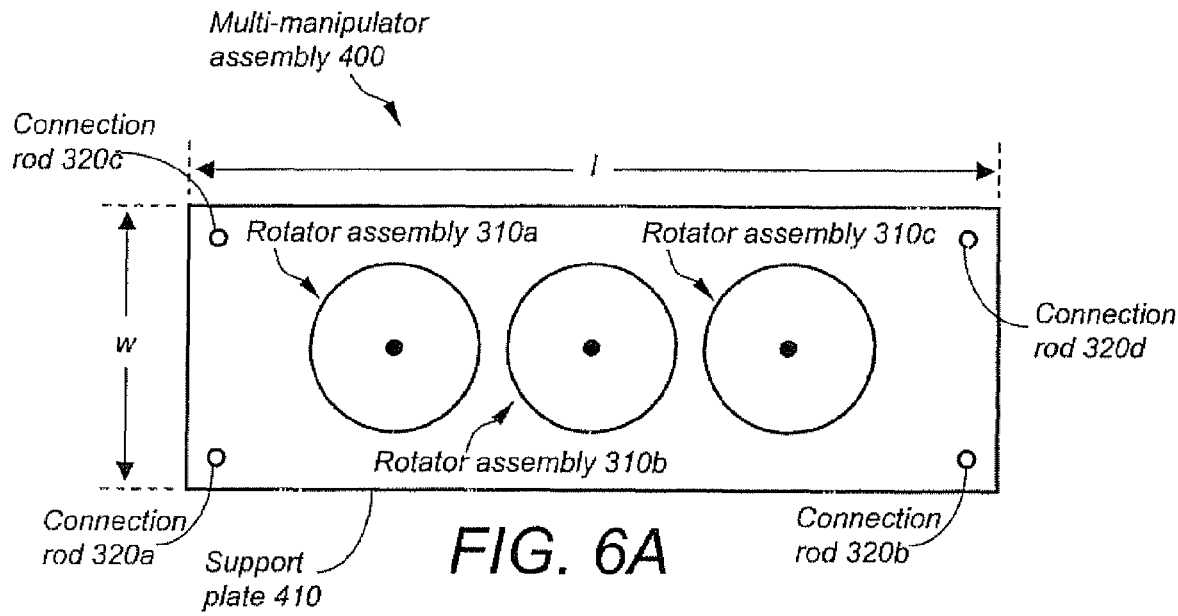
FIGS. 6A and 6B illustrate a top and side view, respectively, of a second embodiment of the multi-target manipulator apparatus of the present invention.
Figure 6B:
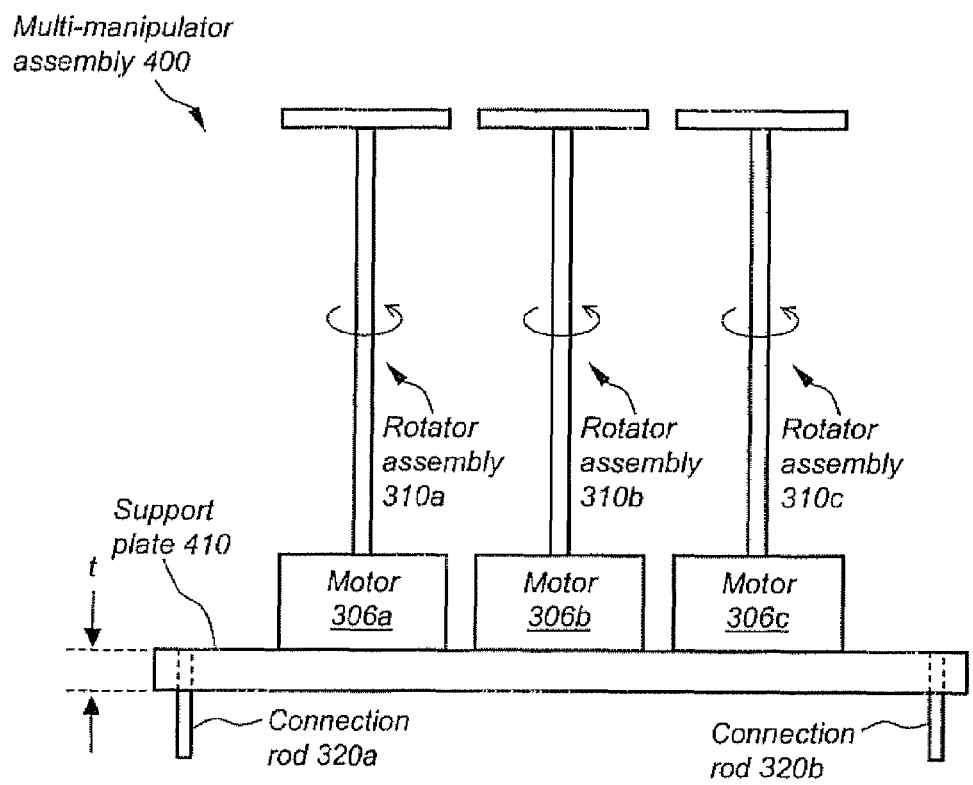

FIGS. 2D, 2E, and 2F illustrate the target impingement geometries that are the result of various actions of a conventional target manipulator. FIGS. 2D, 2E, and 2F are provided as background and to gain a basic understanding of the operation of any state of the art target manipulator including a first embodiment of the multi-target manipulator apparatus of the present invention that is shown in FIGS. 5A and 5B, and a second embodiment of the multi-target manipulator apparatus of the present invention that is shown in FIGS. 6A, and 6B.

As well known in the art, target manipulators provide rotational motion as well as side-to-side oscillation. The side-to-side oscillation is provided with variable speed to optimize the target material usage. For illustration only, FIGS. 2D, 2E, and 2F incrementally demonstrate each motion and the resulting target usage.

With reference to the top and cross-sectional views of FIG. 2D, FIG. 2D illustrates the target 136 having rotational motion only and a resulting continuous circular trench 312a having sloped walls. The trench 312a is formed in the target 136 by the action of the laser beam striking the surface of the target 136. As the target 136 rotates, the sloped walls of the trench 312a at a laser impingement area 308a causes the direction of the plume 212 to be tilted toward the incoming laser beam 210 instead of remaining perpendicular to the surface of the target 136 and properly directed toward the substrate 140. The result is that the deposition process is not uniform or efficient. Additionally, the center area of the target 136 remains unused, therefore limiting the time of operation. Consequently, a simple rotating target 136, alone, is not acceptable.

With reference to the top and cross-sectional views of FIG. 2E, FIG. 2E illustrates the target 136 having rotational motion and uniform-speed side-to-side oscillation and a resulting much larger circular laser impingement area 308b having sloped walls. A trench 312b is formed in the target 136 by the action of the laser beam striking the surface of the target 136. The dish-shaped trench 312b is formed in the target 136, where the depth of the dish-shaped trench 312b is not uniform across the full diameter of the dish-shaped trench 312b. Again, the sloped walls of the trench 312b at the laser impingement area 308b causes the direction of the plume 212 to be tilted toward the incoming laser beam instead of remaining perpendicular to the surface of the target 136 and properly directed toward the substrate 140. Although the time of operation is increased because a larger target area is being utilized, the rotating and uniform-speed side-to-side oscillating motion of the target 136 is still not acceptable.

With reference to the top and cross-sectional views of FIG. 2F, FIG. 2F illustrates the target 136 having rotational motion and variable speed side-to-side oscillation and a large circular laser impingement area 308c having perpendicular walls. A trench 312c is formed in the target 136 by the action of the laser beam striking the surface of the target 136. The dish-shaped trench 312c is formed in the target 136, where the depth of the dish-shaped trench 312c is uniform across the full diameter of the dish-shaped trench 312c due to the variable side-to-side speed control (i.e., the side-to-side motion is at its highest speed when the laser beam translates across the center area of the target 136 and is at its lowest speed when the laser beam translates near the outer radius of the target 136). Consequently, the perpendicular walls of the trench 312c at the laser impingement area 308c causes the direction of the plume 212 to remain perpendicular to the surface of the target 136 and properly directed toward the substrate 140. Nearly all of the target 136 material is consumed, as compared with the simple rotating target 136, or the rotating and oscillating with uniform speed target 136. As a result, the combination of the rotating and variable speed side-to-side oscillating motion of the target 136 provides maximum operation time by allowing the maximum amount of target 136 material to be used before replacement it needed. The rotating and variable-speed side-to-side oscillating motion of the target 136 is acceptable.

FIGS. 5A-5B and 6A-6B illustrate additional embodiments, respectively, of a multi-target manipulator in accordance with the invention that provides the rotational motion and variable speed side-to-side oscillation as described in FIG. 2F for multiple targets simultaneously in a PLD application.

In a first embodiment, FIGS. 5A and 5B illustrate a top and side view, respectively, of a multi-manipulator assembly 350 of the present invention. The multi-manipulator assembly 350 includes a rotator assembly 310a, a rotator assembly 310b, and a rotator assembly 310c. The rotator assembly 310a further includes a motor 306a mechanically connected to a target holder 124a via a shaft 316a. The rotator assembly 310b further includes a motor 306b mechanically connected to a target holder 124b via a shaft 316b. Likewise, the rotator assembly 310c further includes a motor 306c mechanically connected to a target holder 124c via a shaft 316c. The rotator assemblies 310a, 310b, and 310c are mechanically interconnected by feeding the shafts 316a, 316b, and 316c, respectively, through a support bar 318. The shafts 316a, 316b, and 316c may be solid shafts that pass through the support bar 318 and allowed to rotate via conventional bearing assemblies inserted within the support bar 318. Alternatively, the shafts 316a, 316b, and 316c may be an assembly where each includes a hollow cylinder connecting the outer housings of the motors 306a, 306b, and 306c, respectively, to the support bar 318, and where within each hollow cylinder is a rotating shaft passing entirely though the support bar 318 and coupling to the target holders 124a, 124b, and 124c.

The multi-manipulator assembly 350 further includes a connection rod 320a and a connection rod 320b mechanically connected to the support bar 318 at opposing ends. The position and orientation of the connection rods 320a and 320b is not limited to that shown in FIG. 5B. Alternative positions and orientations are possible. A variable-speed side-to-side actuator (not shown) is mechanically attached to the connection rods 320a and 320b. The rotator assemblies 310a, 310b, and 310c are suspended from the support bar 318 within the multi-laser PLD system, and are free to move with the action of the variable-speed side-to-side actuator. Furthermore, to provide mechanical stability, the motors 306a, 306b, and 306c are mechanically coupled to one another and to the support bar 318 via a bracket 322.

Alternatively, a single motor may be mechanically connected using conventional methods to all of the three shafts 316a, 316b, and 316c, subsequently driving the target holders 124a, 124b, and 124c, respectively.

The diameter "d" of the target holders 124a, 124b, and 124c is typically less than two inches so as to enable optimum inter-target spacing and, thus, optimum plume overlap and deposition uniformity. The spacing "e" between the center points of the target holders 124a, 124b, and 124c is set to allow for the optimum plume overlap. The length "l" of the support bar 318 may vary depending on the application and specific mounting requirements. The width "w" and thickness "t" of the support bar 318 are dimensions suitable to accommodate the shafts 316a, 316b, and 316c and are also dimensions suitable to provide strength to the support bar 318 to handle the overall mass of the multi-manipulator assembly 350.

If the multi-manipulator assembly 350 is located entirely within the deposition chamber of the multi-laser PLD system when installed, the variable-speed side-to-side actuator (not shown) and the motors 306a, 306b, and 306c are vacuum-compatible. Alternatively, if the variable-speed side-to-side actuator and the motors 306a, 306b, and 306c are located outside of the deposition chamber of the multi-laser PLD system 100 when installed, the support bar 318 and the shafts 316a, 316b, and 316c are fed through the chamber wall 316 such that a vacuum seal is maintained and such that the side-to-side motion of the multi-manipulator assembly 350 is still allowed.

In operation, the targets 136a, 136b, and 136c are glued onto the target holders 124a, 124b, and 124c, respectively, using a silver paste, such as Ted Pella. The rotator assemblies 310a, 310b, and 310c are activated simultaneously to provide simple rotating motion to the target holders 124a, 124b, and 124c, respectively, and subsequently to the targets 136a, 136b, and 136c, respectively, via the action of the conventional motors 306a, 306b, and 306c, respectively. The variable-speed actuator (not shown) attached to the connection rods 320a and 320b is activated to provide the variable-speed side-to-side oscillating motion to the target holders 124a, 124b, and 124c.

As a result, the multi-manipulator assembly 350 of the present invention provides the rotating and variable-speed side-to-side oscillating motion to the targets 136a, 136b, and 136c, thereby providing optimized operation time required in a high-throughput PLD process. Additionally, the use of the multi-manipulator assembly 350 of the present invention in a PLD process allows a faster film deposition process for a given thickness or allows for a thicker film deposition for a given PLD process speed.

It is important to note that the multi-manipulator assembly 350 of the present invention is not limited to three rotor assemblies as shown in FIGS. 5A and 5B. The multi-manipulator assembly 350 of the present invention could be implemented with any number of rotator assemblies.

In a second embodiment, FIGS. 6A and 6B illustrate a top and side view, respectively, of a multi-manipulator assembly 400 of the present invention. The multi-manipulator assembly 400 is identical to the multi-manipulator assembly 350 of FIGS. 5A and 5B, differing only in that the rotator assemblies 310a, 310b, and 310c are mounted on a support plate 410 instead of interconnecting with the support bar 318. As in FIGS. 5A and 5B, a plurality of the connection rods 320a, 320b, 320c, and 320d are mechanically connected to the support plate 410 at each corner. The position and orientation of the connection rods 320a, 320b, 320c, and 320d is not limited to that shown in FIGS. 6A and 6B. Alternative positions and orientations are possible. As in FIGS. 5A and 5B, a variable-speed actuator (not shown) is mechanically attached to the connection rods 320a, 320b, 320c, and 320d.

The operation is identical to that of the multi-manipulator assembly 350 described in FIGS. 5A and 5B, differing only in that the entire assembly, including the rotator assemblies 310a, 310b, and 310c, are subjected to the variable-speed side-to-side oscillating motion of the actuator.

If the motors 306a, 306b, and 306c are vacuum-compatible motors, the multi-manipulator assembly 400 is located entirely within the multi-laser PLD system. Alternatively, the motors 306a, 306b, and 306c mounted on the support plate 410 are disposed outside of the multi-laser PLD system 100 and the shafts 316a, 316b, and 316c are fed through the chamber wall.

What is claimed is:

1. A method comprising:
    feeding an uncoated substrate from a payout spool into a multi-chambered vacuum apparatus, the vacuum apparatus comprising plurality of deposition chambers defining an extended deposition zone, a multi-zone substrate heater located within the extended deposition zone, multiple high-temperature superconductor (HTS) targets located within and being arranged linearly along the extended deposition zone, the multiple HTS targets including a first HTS target and a second HTS target, the first HTS target comprising a HTS material and the second HTS target comprising said HTS material;
    translating the uncoated substrate along a translation path through the plurality of deposition chambers;
    impinging multiple laser beams simultaneously upon the multiple HTS targets and forming multiple overlapping plumes of HTS material within the extended deposition zone while imparting rotary and oscillatory motion to the multiple targets, wherein the multiple HTS targets oscillate in a direction parallel to the translation path;
    depositing HTS material on a first major surface of the uncoated substrate from the multiple overlapping plumes to provide a coated substrate; and
    winding the coated substrate onto a take-up spool.

2. The method of claim 1, wherein the multi-zone substrate heater comprises at least three zones.

3. The method of claim 1, wherein the multi-zone substrate heater heats the uncoated substrate by at least one of conductive and radiative heat transfer.

4. The method of claim 1, wherein the multi-zoned substrate heater comprises a susceptor.

5. The method of claim 4, wherein the uncoated substrate further comprises a second major surface, the second major surface opposing and being co-planer to the first major surface and the second major surface facing the susceptor.

6. The method of claim 5, wherein the second major surface of the uncoated substrate is in contact with the susceptor.

7. The method of claim 4, wherein the uncoated substrate is maintained in contact with the susceptor as it translates through the deposition zone.

8. The method of claim 7, wherein the susceptor has a transversely concavely curved outer surface along which the uncoated substrate translates.

9. The method of claim 8, wherein the susceptor has a radius of curvature of about 5 to about 10 meters.

10. The method of claim 1, wherein the uncoated substrate is heated to a deposition temperature between about 500° C. and about 900° C.

11. The method of claim 10, wherein the uncoated substrate is heated to a deposition temperature between about 750° C. and about 830° C.

12. The method of claim 1, wherein the uncoated substrate is translated at a speed of 10 to 500 meters per hour.

13. The method of claim 1, wherein the uncoated substrate comprises a nickel based alloy.

14. The method of claim 1, wherein the multiple targets are coupled to a common target manipulator, such that the targets undergo identical oscillatory motion.

15. The method of claim 1, wherein the HTS material comprises $REBa_2Cu_3O_{7-x}$, wherein RE is a rare earth element.

16. The method of claim 15, wherein the HTS material comprises $YBa_2Cu_3O_7$.

17. The method of claim 1, wherein the multiple laser beams are produced by different lasers.

18. The method of claim 1, wherein winding the coated substrate onto the take-up spool includes winding a length of polymer interleaf between layers of the coated substrate tape.

19. The method of claim 1, wherein the uncoated substrate has a length to width ratio of not less than about $10^3$.

* * * * *

UNITED STATES PATENT AND TRADEMARK OFFICE
CERTIFICATE OF CORRECTION

PATENT NO. : 7,501,145 B2
APPLICATION NO. : 11/554428
DATED : March 10, 2009
INVENTOR(S) : Venkat Selvamanickam et al.

It is certified that error appears in the above-identified patent and that said Letters Patent is hereby corrected as shown below:

Title Page, section (54) and col. 1, lines 1-2; Title, please delete "HIGH THROUGHPUT CONTINUOUS PULSED LASER DEPOSITION PROCESS" and insert therefor --HIGH THROUGHPUT CONTINUOUS PULSED LASER DEPOSITION PROCESS AND APPARATUS--.

Column 3, line 57, please delete "," and insert therefor --.--.

Column 13, line 43, please delete "if" and insert therefor --in--.

Column 17, line 25, please delete "PITS" and insert therefor --HTS--.

Column 17, line 28, please delete "PITS" and insert therefor --HTS--.

Column 18, line 26, please delete "HITS" and insert therefor --HTS--.

Signed and Sealed this
Twelfth Day of July, 2011

David J. Kappos
*Director of the United States Patent and Trademark Office*